(12) United States Patent
Miura et al.

(10) Patent No.: US 10,229,992 B2
(45) Date of Patent: Mar. 12, 2019

(54) SEMICONDUCTOR DEVICE AND MANUFACTURING METHOD OF SEMICONDUCTOR DEVICE

(71) Applicant: Renesas Electronics Corporation, Tokyo (JP)

(72) Inventors: Yoshinao Miura, Tokyo (JP); Hironobu Miyamoto, Hitachinaka (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/904,701

(22) Filed: Feb. 26, 2018

(65) Prior Publication Data
US 2018/0308968 A1    Oct. 25, 2018

(30) Foreign Application Priority Data

Apr. 21, 2017    (JP) ................ 2017-084350

(51) Int. Cl.
*H01L 29/778*  (2006.01)
*H01L 29/20*   (2006.01)
*H01L 29/205*  (2006.01)
*H01L 29/06*   (2006.01)
*H01L 29/417*  (2006.01)
(Continued)

(52) U.S. Cl.
CPC ...... *H01L 29/7787* (2013.01); *H01L 21/0254* (2013.01); *H01L 21/02389* (2013.01); *H01L 29/0657* (2013.01); *H01L 29/2003* (2013.01); *H01L 29/205* (2013.01); *H01L 29/41758* (2013.01); *H01L 29/475* (2013.01); *H01L 29/66462* (2013.01); *H01L 21/0273* (2013.01); *H01L 21/28581* (2013.01); *H01L 21/30621* (2013.01); *H01L 21/32139* (2013.01)

(58) Field of Classification Search
CPC .............. H01L 29/2003; H01L 29/205; H01L 29/7787
See application file for complete search history.

(56) References Cited

U.S. PATENT DOCUMENTS

| 7,132,699 | B2 * | 11/2006 | Kimura | ............ | H01L 29/66462 257/192 |
| 7,576,373 | B1 * | 8/2009 | Hikita | ............... | H01L 29/66462 257/192 |
| 8,692,292 | B2 | 4/2014 | Umeda et al. | | |

FOREIGN PATENT DOCUMENTS

JP    2011-29506 A    2/2011

\* cited by examiner

*Primary Examiner* — Dung Le
(74) *Attorney, Agent, or Firm* — Sughrue Mion, PLLC

(57) ABSTRACT

Characteristics of a semiconductor device are improved. A semiconductor device of the present invention includes a buffer layer composed of a first nitride semiconductor layer, a channel layer composed of a second nitride semiconductor layer, and a barrier layer composed of a third nitride semiconductor layer, which are sequentially laminated, and a cap layer composed of a fourth nitride semiconductor layer of mesa type, which is formed over the barrier layer. The semiconductor device also includes a source electrode formed on one side of the cap layer, a drain electrode formed on the other side of the cap layer, and a first gate electrode formed over the cap layer. The first gate electrode and the cap layer are Schottky-joined. A Schottky gate electrode (the first gate electrode) is provided over the cap layer in this way, so that when a gate voltage is applied, an electric field is applied to the entire cap layer and a depletion layer spreads. Therefore, it is possible to suppress a gate leakage current.

20 Claims, 20 Drawing Sheets

(51) Int. Cl.
H01L 29/47 (2006.01)
H01L 21/02 (2006.01)
H01L 29/66 (2006.01)
H01L 21/3213 (2006.01)
H01L 21/306 (2006.01)
H01L 21/027 (2006.01)
H01L 21/285 (2006.01)

SEMICONDUCTOR DEVICE AND MANUFACTURING METHOD OF SEMICONDUCTOR DEVICE

CROSS-REFERENCE TO RELATED APPLICATIONS

The disclosure of Japanese Patent Application No. 2017-084350 filed on Apr. 21, 2017 including the specification, drawings and abstract is incorporated herein by reference in its entirety.

BACKGROUND

The present invention relates to a semiconductor device and a manufacturing method of a semiconductor device, and for example, the present invention can be preferably used for a semiconductor device using a nitride semiconductor and a manufacturing method thereof.

A transistor using a GaN-based nitride semiconductor uses two-dimensional electron gas generated at an interface between different nitride semiconductor layers, such as, for example, an AlGaN/GaN interface, as a channel (current path). Therefore, such a transistor realizes high-speed switching characteristics and is expected as a device which can reduce power supply loss and which can be downsized.

Among transistors using a GaN-based nitride semiconductor, in particular, a transistor having normally-off characteristics is useful, so that a structure that causes a transistor to have the normally-off characteristics is studied.

For example, Japanese Unexamined Patent Application Publication No. 2011-29506 discloses a normally-off type semiconductor device having a buffer layer composed of an AlN layer, an undoped GaN layer, an undoped AlGaN layer, a p-type AlGaN layer, and a metal layer composed of Pd or WSi over the p-type AlGaN layer, over a main surface of a substrate comprised of sapphire.

SUMMARY

The inventors are engaged in research and development of semiconductor devices using a nitride semiconductor and diligently study about improvement of characteristics in a semiconductor device. In particular, the inventors study about a structure (a mesa type structure) of transistor which causes the transistor to have the normally-off characteristics.

However, in a transistor as described in Japanese Unexamined Patent Application Publication No. 2011-29506 (a so-called JFET having a gate electrode over a p-type nitride semiconductor), the p-type nitride semiconductor and the gate electrode are ohmically coupled, so that there is a problem that a gate leakage current is very high.

Other objects and novel features will become apparent from the description of the present specification and the accompanying drawings.

The following briefly explains the outline of typical embodiments among the embodiments disclosed in the present application.

A semiconductor device described in an embodiment disclosed in the present application includes a buffer layer composed of a first nitride semiconductor layer, a channel layer composed of a second nitride semiconductor layer, and a barrier layer composed of a third nitride semiconductor layer, which are sequentially laminated, and a cap layer (2DEG eliminating layer) composed of a mesa type fourth nitride semiconductor layer formed over the barrier layer. The semiconductor device also includes a source electrode formed on one side of the cap layer, a drain electrode formed on the other side of the cap layer, and a gate electrode formed over the cap layer. The gate electrode and the cap layer are Schottky-joined.

A manufacturing method of a semiconductor device described in an embodiment disclosed in the present application sequentially forms a first nitride semiconductor layer (buffer layer), a second nitride semiconductor layer (channel layer), a third nitride semiconductor layer (barrier layer) a fourth nitride semiconductor layer (cap layer), and a conductive film that is Schottky-joined with the fourth nitride semiconductor layer (cap layer). Then, the manufacturing method forms a laminated body of a mesa type fourth nitride semiconductor layer (cap layer) and a gate electrode by processing the fourth nitride semiconductor layer and the conductive film.

According to a semiconductor device that is disclosed in the present application and described in a typical embodiment described below, it is possible to improve characteristics of the semiconductor device.

According to a manufacturing method of a semiconductor device that is disclosed in the present application and described in a typical embodiment described below, it is possible to manufacture a semiconductor device having good characteristics.

DETAILED DESCRIPTION

Figure 1:
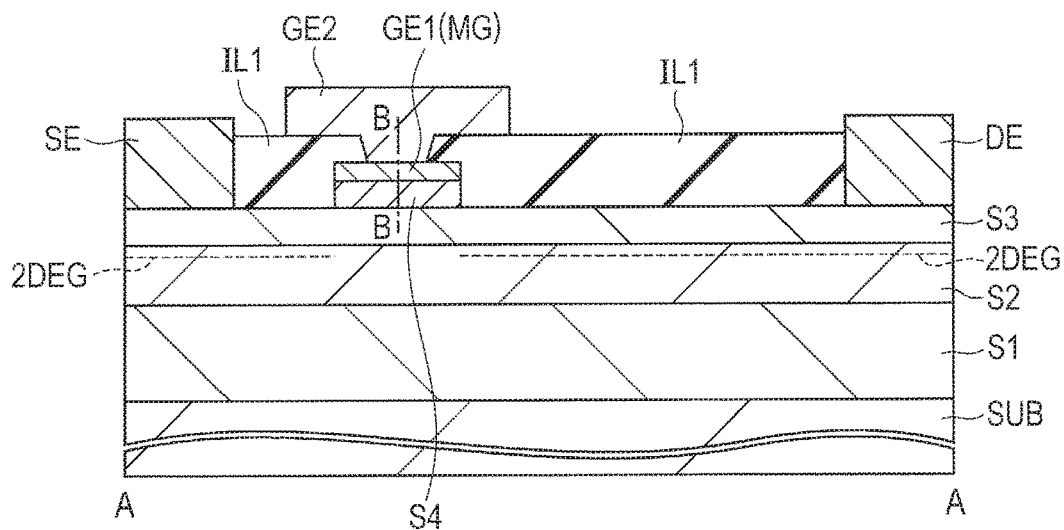
FIG. 1 is a cross-sectional view showing a configuration of a semiconductor device of a first embodiment.

The following embodiments will be explained, divided into plural sections or embodiments, if necessary for convenience. Except for the case where it shows clearly in particular, they are not mutually unrelated and one has relationships such as a modification, an application, details, and supplementary explanation of some or entire of another. In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Further, in the following embodiments, an element (including an element step etc.) is not necessarily indispensable, except for the case where it is clearly specified in particular and where it is considered to be clearly indispensable from a theoretical point of view, etc. Similarly, in the following embodiments, when shape, position relationship, etc. of an element etc. are referred to, what resembles or is similar to the shape, etc. substantially shall be included, except for the case where it is clearly specified in particular and where it is considered to be clearly not right from a theoretical point of view. This statement also applies to the number of elements, etc. (including the number, a numeric value, an amount, a range, etc.) described above.

Hereinafter, embodiments will be described with reference to the drawings. In all the drawings for explaining the embodiments, the same symbol or a related symbol is attached to members having the same function, and the repeated explanation thereof is omitted. When there is a plurality of similar members (regions), an individual or a specific region may be represented by adding a sign to a generic symbol. In the embodiments described below, in principle, the same or similar component will not be repeatedly described unless otherwise required.

In the drawings used in the embodiments, even if the drawing is a cross-sectional view, hatching may be omitted to make the drawing easy to see. Further, hatching may be used even in a plan view so as to make the drawings easy to see.

Further, in a cross-sectional view and a plan view, the size of each region does not correspond to the size of a real device, and the size of a specific region may be shown relatively larger than it actually is to make the drawing easy to understand. Furthermore, when a cross-sectional view and a plan view correspond to each other, the size of a specific region may also be shown relatively larger than it actually is to make the drawing easy to understand.

First Embodiment

Hereinafter, a semiconductor device of the present embodiment will be described in detail with reference to the drawings.

[Explanation of Structure]

FIG. 1 is a cross-sectional view showing a configuration of the semiconductor device of the present embodiment. The semiconductor device shown in FIG. 1 is a high breakdown voltage transistor (for example, the breakdown voltage is about 600 V) (the same goes for the first to the sixth embodiments).

In the semiconductor device of the present embodiment, a first nitride semiconductor layer S1, a second nitride semiconductor layer S2, and a third nitride semiconductor layer S3 are sequentially formed over a substrate SUB. A fourth nitride semiconductor layer S4 is formed over a part of the third nitride semiconductor layer S3. The first nitride semiconductor layer S1 and the like may be formed after forming a nucleation layer and a high-resistance buffer layer over the nucleation layer over the substrate SUB.

As the substrate SUB, it is possible to use, for example, a semiconductor substrate comprised of silicon (Si) whose (111) surface is exposed. As the substrate SUB, it is also possible to use a substrate comprised of SiC, sapphire, or the like instead of the silicon. Further, it is possible to use a substrate formed of GaN. In this case, the nucleation layer may be omitted.

The nucleation layer is comprised of a nitride semiconductor layer. As the nucleation layer, it is possible to use, for example, an aluminum nitride (AlN) layer. The high-resistance buffer layer is comprised of one nitride semiconductor layer or a plurality of nitride semiconductor layers, to which an impurity that forms a deep level is added. For example, as a superlattice structure (also referred to as a superlattice layer) comprised of a plurality of nitride semiconductor layers, a superlattice structure formed by repeatedly laminating a laminated film (AlN/GaN film) of a gallium nitride (GaN) layer and an aluminum nitride (AlN) layer can be used as the high-resistance buffer layer.

Normally, all the nitride semiconductor layers (compound semiconductor layers of III-V groups) over the substrate SUB are formed by group-III element surface growth.

As described above, the first nitride semiconductor layer S1, the second nitride semiconductor layer S2, and the third nitride semiconductor layer S3 are sequentially formed over the substrate SUB. The fourth nitride semiconductor layer S4 is formed over a part of the third nitride semiconductor layer S3.

Electron affinity of the second nitride semiconductor layer S2 is greater than or equal to that of the first nitride semiconductor layer S1 (S1≤S2).

Electron affinity of the third nitride semiconductor layer S3 is smaller than that of the first nitride semiconductor layer S1 (S1>S3).

The fourth nitride semiconductor layer S4 is mesa type (has a mesa shape, a convex shape, or a line shape). Electron affinity of the fourth nitride semiconductor layer S4 is greater than or equal to that of the second nitride semiconductor layer S2 (S4≥S2).

The first nitride semiconductor layer S1 is also called a buffer layer and is formed of, for example, AlGaN. The second nitride semiconductor layer S2 is also called a channel layer and is formed of, for example, GaN. The third nitride semiconductor layer S3 is also called a barrier layer (an electron supply layer) and is formed of, for example, AlGaN. However, the Al composition is greater than that of the first nitride semiconductor layer S1. The mesa type fourth nitride semiconductor layer S4 is also called a cap layer and is formed of, for example, i-GaN. In this way, the mesa type fourth nitride semiconductor layer S4 (the cap layer) is a non-doped layer (for example, an i-GaN layer). The non-doped layer means a layer where impurities are not intentionally introduced.

A first gate electrode GE1 is formed over the mesa type fourth nitride semiconductor layer (cap layer) S4. The mesa type fourth nitride semiconductor layer (cap layer) S4 and the first gate electrode GE1 are Schottky-joined as described later.

An interlayer insulating film IL1 is formed over the first gate electrode GE1. A second gate electrode GE2 is formed over the first gate electrode GE1 through an opening portion of the interlayer insulating film IL1. A source electrode SE and a drain electrode DE are formed over the third nitride semiconductor layer (barrier layer) S3 and on both sides of the mesa type fourth nitride semiconductor layer (cap layer) S4. For example, contact holes (coupling holes) are formed in the interlayer insulating film IL1, and the source electrode SE and the drain electrode DE are arranged inside and above the contact holes. Each of the source electrode SE and the drain electrode DE is ohmically coupled with the third nitride semiconductor layer (barrier layer) S3 under them.

Figure 2:
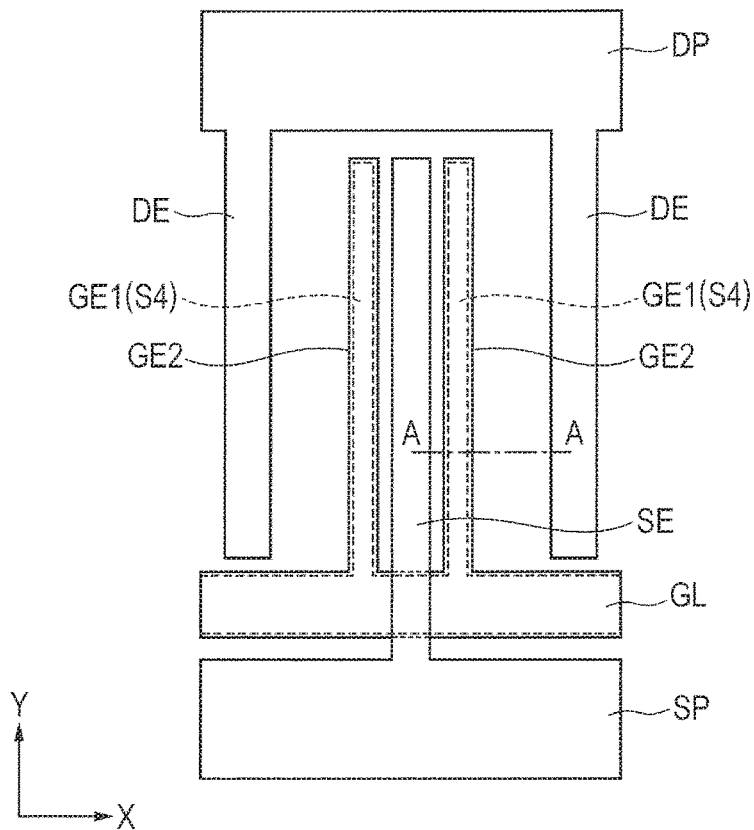
FIG. 2 is a plan view showing a configuration of the semiconductor device of the first embodiment.
Figure 3:
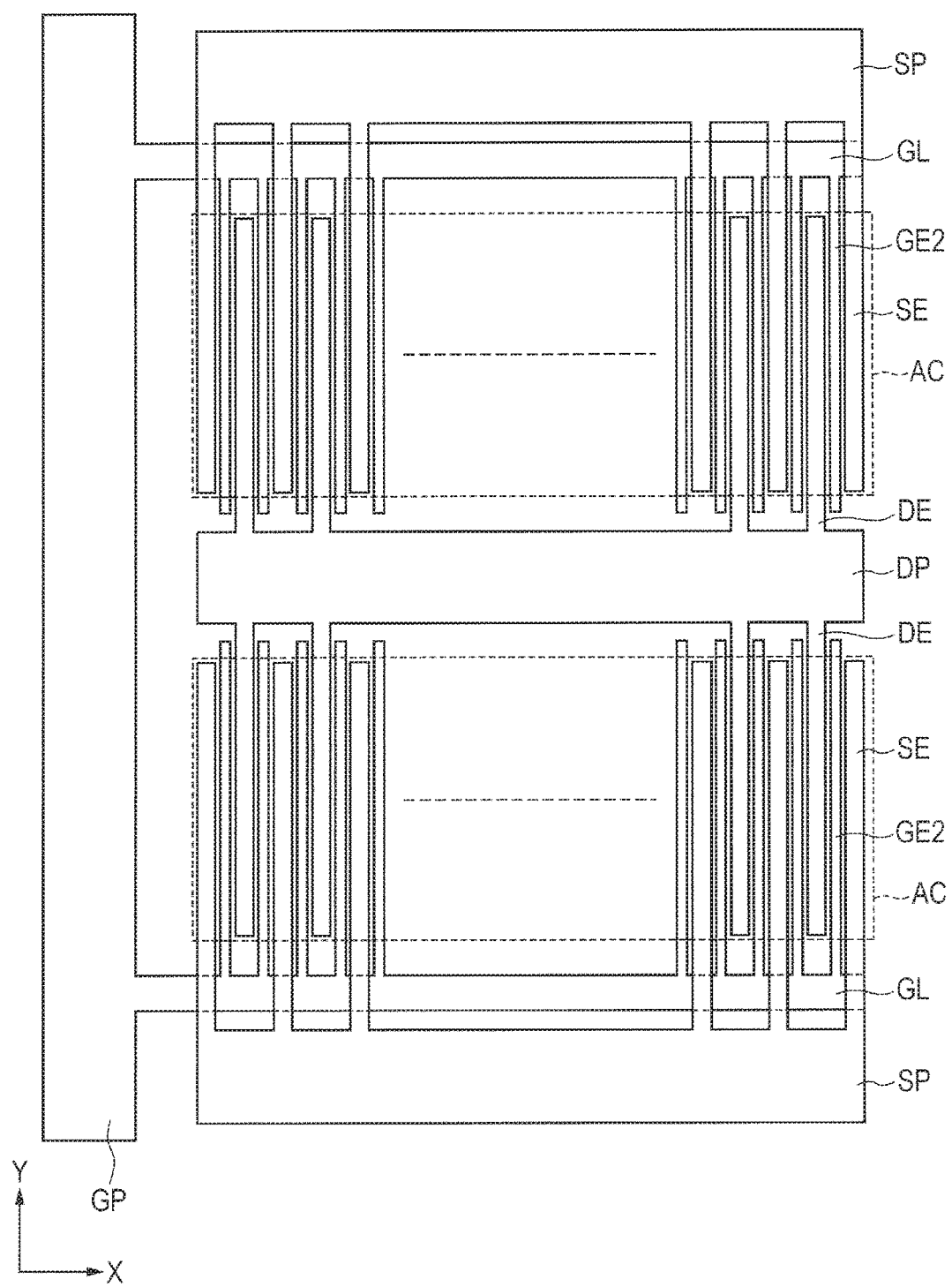
FIG. 3 is a plan view showing a configuration of the semiconductor device of the first embodiment.

A plane configuration of the semiconductor device of the present embodiment will be described in further detail with reference to FIGS. 1 to 3. FIGS. 2 and 3. are plan views showing a configuration of the semiconductor device of the present embodiment. FIG. 1 described above corresponds to a portion A-A in FIG. 2. FIG. 2 corresponds to a part of FIG. 3.

As shown in FIG. 2, a planar shape of the drain electrode DE is a rectangular shape having a long side in a Y direction. A planar shape of the source electrode SE is a rectangular shape having a long side in the Y direction. A laminated body of the mesa type fourth nitride semiconductor layer (cap layer) S4 and the first gate electrode GE1 is arranged between the drain electrode DE and the source electrode SE. The laminated body (the first gate electrode GE1) has a rectangular shape having a long side in the Y direction. The gate length of the first gate electrode GE1 is, for example, about 2 μm, and the gate width is, for example, about 200 mm. The second gate electrode GE2 is a little larger than the laminated body of the mesa type fourth nitride semiconductor layer (cap layer) S4 and the first gate electrode GE1. A planar shape of the second gate electrode GE2 is a rectangular shape having a long side in the Y direction.

The drain electrode DE, the second gate electrode GE2, and the source electrode SE shown in FIG. 2 are repeatedly arranged a plurality of times as shown in FIG. 3.

As shown in the lower half of FIG. 3, the planar shape of the drain electrode DE is a rectangular shape having a long side in a Y direction. A plurality of line-shaped drain electrodes DE are arranged at regular intervals in an X direction. The planar shape of the source electrode SE is a rectangular shape having a long side in the Y direction. A plurality of line-shaped source electrodes SE are arranged at regular intervals in the X direction. The plurality of source electrodes SE and the plurality of drain electrodes DE are alternately arranged, respectively, along the X direction. The second gate electrode GE2 is arranged between the drain electrode DE and the source electrode SE.

The plurality of drain electrodes DE are coupled by a drain pad (also referred to as a terminal portion) DP. The drain pad DP is arranged on one end sides of the drain electrodes DE (in a central portion of FIG. 3) so as to extend in the X direction. In other words, the plurality of drain electrodes DE are arranged so as to protrude in the Y direction from the drain pad DP extending in the X direction. Such a shape may be called as a comb shape.

The plurality of source electrodes SE are coupled by a source pad (also referred to as a terminal portion) SP. The source pad SP is arranged on the other end sides of the source electrodes SE (in a lower portion of FIG. 3) so as to extend in the X direction. In other words, the plurality of source electrodes SE are arranged so as to protrude in the Y direction from the source pad SP extending in the X direction. Such a shape may be called as a comb shape.

The plurality of second gate electrode GE2 are coupled by a gate line GL. The gate line GL is arranged on one end sides of the second gate electrode GE2 (in a lower portion of FIG. 3) so as to extend in the X direction. In other words, the plurality of second gate electrode GE2 are arranged so as to protrude in the Y direction from the gate line GL extending in the X direction. The gate line GL is coupled with, for example, a gate pad GP provided at an end portion in the X direction of the gate line GL (at left side in FIG. 3).

While the laminated body of the mesa type fourth nitride semiconductor layer (cap layer) S4 and the first gate electrode GE1 is arranged below the second gate electrode GE2 as described above, the laminated body of the mesa type fourth nitride semiconductor layer (cap layer) S4 and the first gate electrode GE1 is also arranged below the gate line GL.

The gate line GL, the second gate electrode GE2, the first gate electrode GE1, the source pad SP, the source electrode SE, and the drain electrode DE are arranged vertically symmetrically with the drain pad DP at the center of FIG. 3 as the axis of symmetry.

The source electrode SE, the drain electrode DE, the second gate electrode GE2, and the first gate electrode GE1 are mainly arranged over an active region AC surrounded by an element isolation region ISO. A planar shape of the active region AC is a substantially rectangular shape having a long side in the X direction. On the other hand, the drain pad DP, the gate line GL, the source pad SP, and the gate pad GP are arranged over the element isolation region ISO. The element isolation region ISO is a high resistance region whose crystallinity is broken by ion implantation or the like in the nitride semiconductor layer.

Here, 2DEG (two-dimensional electron gas) occurs at an interface between the second nitride semiconductor layer S2 and the third nitride semiconductor layer S3 (FIG. 1). However, under the first gate electrode GE1, the mesa type fourth nitride semiconductor layer (cap layer) S4 is provided, so that the 2DEG occurrence is suppressed. Therefore, only when a predetermined potential (a threshold potential) is applied to the gate electrode GE, a channel is formed under the gate electrode GE1 where the 2DEG occurrence is suppressed, and the transistor becomes an ON state. In this way, the transistor of the present embodiment has normally-off characteristics.

In the transistor of the present embodiment, the mesa type fourth nitride semiconductor layer (cap layer) S4 and the first gate electrode GE1 are Schottky-joined (coupled, or contacted). In other words, the first gate electrode GE1 is used as a Schottky gate electrode. Examples of a material that is Schottky-joined with such a nitride semiconductor layer include a metal material and a metal compound material, which have large work functions. Such a Schottky gate electrode may be referred to as "metal" or "MG". As a material of the first gate electrode GE1, for example, TiN, Pt, Au, Ni, Pd, or the like can be used. Further, a compound material of these materials may be used. A degenerated $n^+$ polysilicon or a degenerated $p^+$ polysilicon may be used instead of a metal material. A Schottky junction portion between the mesa type fourth nitride semiconductor layer (cap layer) S4 and the first gate electrode GE1 need not necessarily be the entire mesa type fourth nitride semiconductor layer (cap layer) S4 but may be a part of the mesa type fourth nitride semiconductor layer (cap layer) S4.

In this way, the Schottky gate electrode (the first gate electrode GE1) is provided over the mesa type fourth nitride semiconductor layer (cap layer) S4, so that when a gate voltage is applied, an electric field is applied to the entire mesa type fourth nitride semiconductor layer (cap layer) S4 and a depletion layer spreads. Therefore, it is possible to suppress a gate leakage current.

Figure 4A:
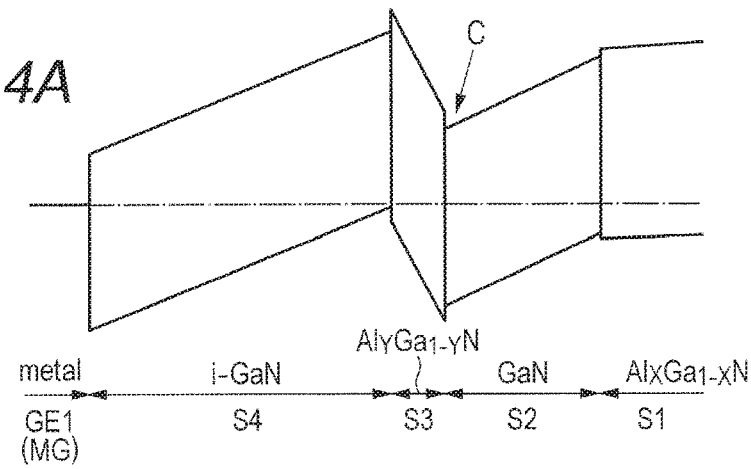
FIGS. 4A to 4C are diagrams showing a band profile near a first gate electrode of the semiconductor device of the first embodiment.
Figure 4B:
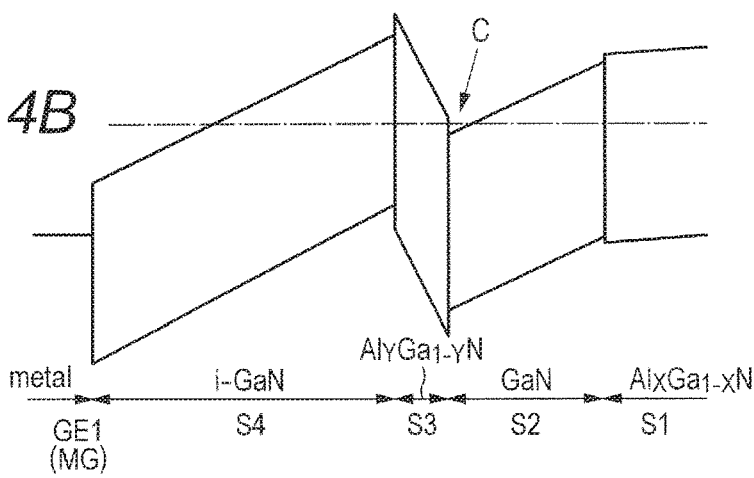
Figure 4C:
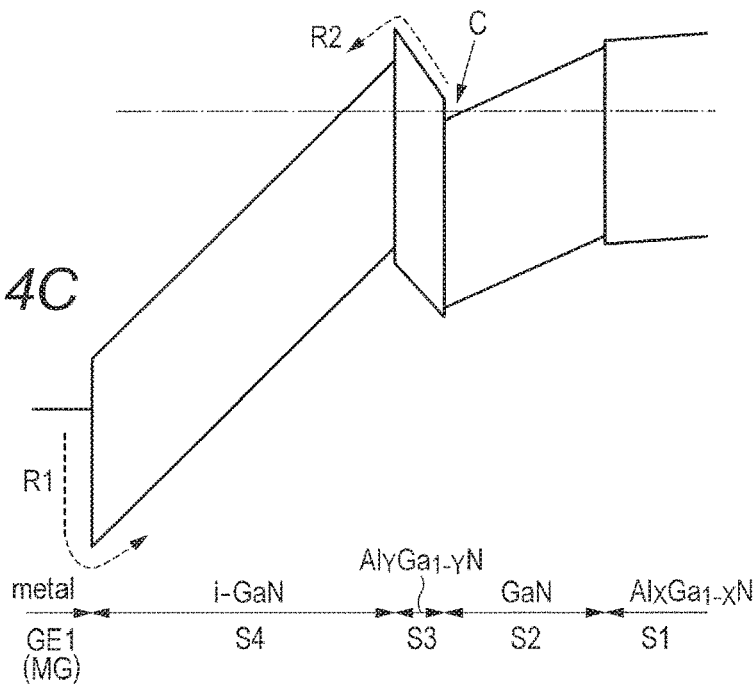

FIGS. 4A to 4C are diagram showing a band profile near the first gate electrode of the semiconductor device (transistor) of the first embodiment. Specifically, FIGS. 4A to 4C show a band profile of a portion B-B (FIG. 1) that is near the first gate electrode GE1. In FIGS. 4A to 4C, FIG. 4A shows a case where a first gate voltage Vg is 0 V, FIG. 4B shows a case where the first gate voltage Vg is 2 V, and FIG. 4C shows a case where the first gate voltage Vg is 5 V. As shown in FIGS. 4A to 4C, when a positive voltage is gradually applied to the first gate electrode GE1 from an off state (Vg=0 V) shown in FIG. 4A, a potential at a conduction band end gradually decreases, and when a point C (S3/S2 interface that becomes a channel) where the potential is low reaches the Fermi level (dashed-dotted line), electrons start to accumulate (FIG. 4B). A gate voltage at this time is a threshold value (Vth, for example, 2 V), and it is known that the transistor of the present embodiment has normally-off characteristics (Vth>0 V). When a gate voltage higher than the threshold value (Vg>Vth, for example, 5 V) is applied, electron density at the point C increases, a channel is formed, and an ON state is completely established. In this case, mobility of electrons increases to, for example, 1500 $cm^2/Vsec$ or more, and the resistance of the channel becomes low.

Figure 5:
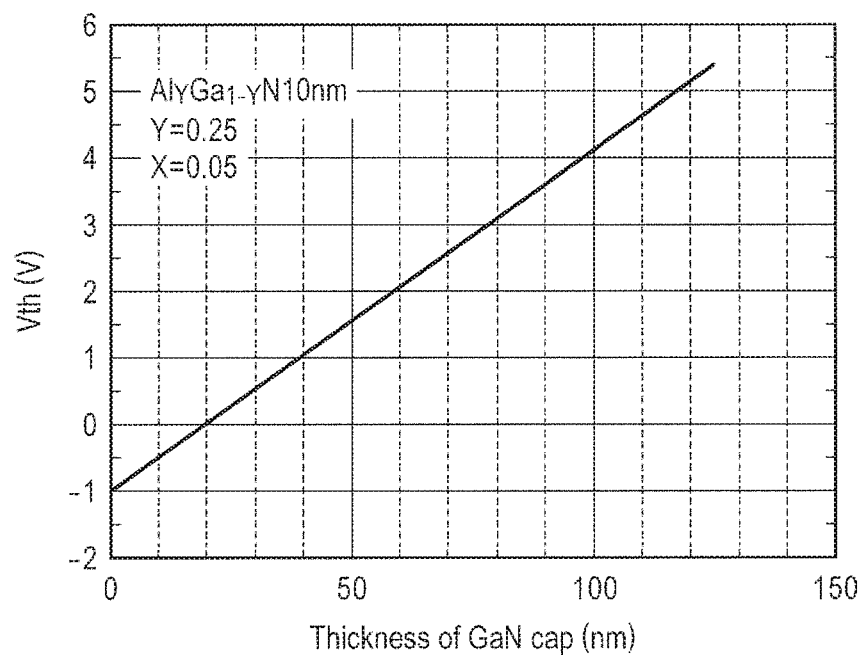
FIG. 5 is a graph showing a film thickness of a mesa type fourth nitride semiconductor layer and a threshold value.

The threshold value (Vth) varies according to the compositions and the thicknesses of S1 to S4. FIG. 5 is a graph showing a film thickness of the mesa-type fourth nitride semiconductor layer (cap layer, GaN cap) and the threshold value (Vth). For example, the first nitride semiconductor layer (buffer layer) S1 is assumed to be AlGaN having a thickness of 1000 nm and an Al concentration of 5%, the second nitride semiconductor layer (channel layer) S2 is assumed to be GaN having a thickness of 30 nm, and the third nitride semiconductor layer (barrier layer) S3 is assumed to be AlGaN having a thickness of 60 nm and an Al concentration of 25%. Further, the first gate electrode GE1 is assumed to be TiN having a Schottky barrier height of 1.0 V. In this case, as shown in FIG. 5, as the thickness (nm) of the mesa type fourth nitride semiconductor layer (cap layer) S4 indicated by the horizontal axis increases, the threshold value (Vth, V) indicated by the vertical axis increases. For example, when the mesa type fourth nitride semiconductor layer (cap layer) S4 is GaN of 60 nm, the threshold value (Vth) is about 2 V. FIGS. 4A to 4C are band diagrams in the above condition.

As described above, when the gate voltage further rises above the threshold value, a potential barrier between the first gate electrode GE1 and the channel is lowered downward on the first gate electrode GE1 side (FIG. 4C). Here, a gate leakage current is generated by (1) a route R1 through which holes are discharged from the first gate electrode GE1 side to the S3/S2 interface and (2) a route R2 through which electrons accumulated at the point C (S3/S2 interface that becomes the channel) are discharged to the first gate electrode GE1 side. However, in the present embodiment, the Schottky gate electrode (the first gate electrode GE1) is provided over the mesa type fourth nitride semiconductor layer (cap layer) S4, so that a barrier for the holes (the route R1) increases (rises) and a depletion layer spreads in the mesa type fourth nitride semiconductor layer (cap layer) S4. Therefore, the gate leakage current can be suppressed. In FIG. 4C, a barrier (the route R1) for holes of 1 V or higher remains. Further, due to the first nitride semiconductor layer (buffer layer) S1, a barrier for electrons (the route R2) also increases (rises), so that the gate leakage current can be suppressed.

Further, the mesa type fourth nitride semiconductor layer (cap layer) S4 is a non-doped layer (for example, i-GaN), so that the potential barrier between the first gate electrode GE1 and the channel can be largely lowered downward on the first gate electrode GE1 side (FIGS. 4A to 4C) and the breakdown voltage can be increased.

Figure 30A:
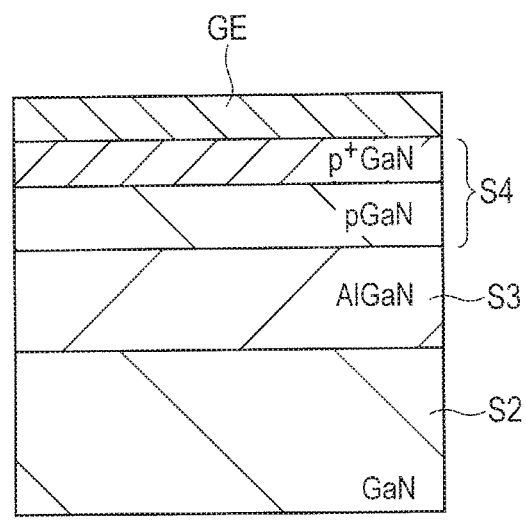
FIGS. 30A and 30B are diagrams showing a configuration and a band profile a near a gate electrode of a semiconductor device of a comparative example.
Figure 30B:
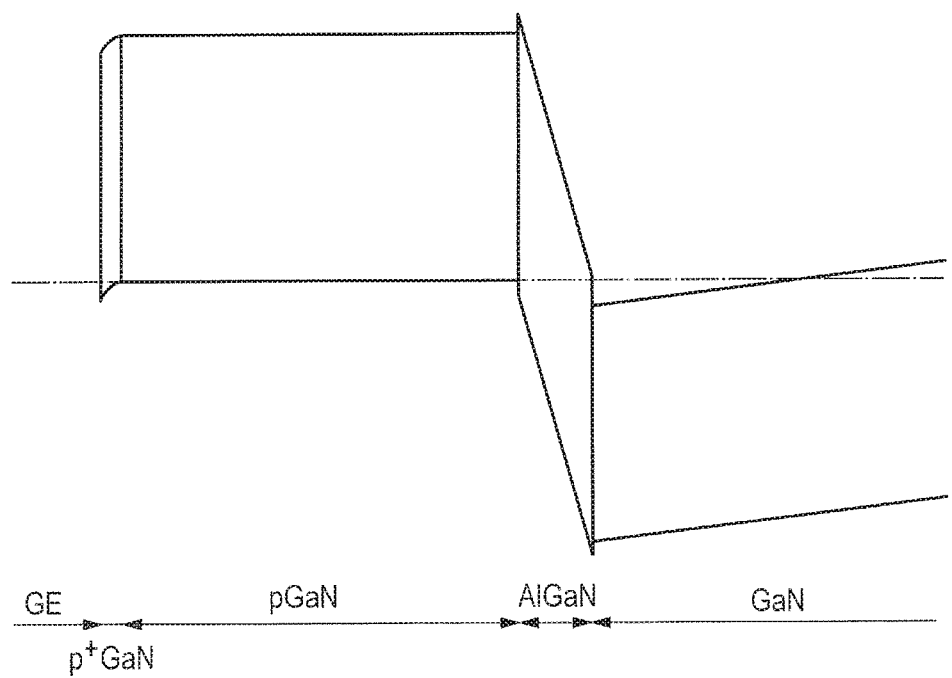

FIGS. 30A and 30B are diagrams showing a configuration and a band profile a near a gate electrode of a semiconductor device (transistor) of a comparative example. FIG. 30A shows the configuration of the comparative example. FIG. 30B shows a band profile when the gate voltage Vg is 0 V. As shown in FIG. 30A, the semiconductor device of the comparative example has a so-called JEFT structure where the gate electrode GE is ohmically coupled over a cap layer ($p^+$GaN/pGaN) S4. A barrier layer (AlGaN) S3 is provided under the cap layer ($p^+$GaN/pGaN) S4. Further, a channel layer (GaN) S2 is provided under the barrier layer (AlGaN) S3. As shown in FIG. 30B, when the ohmically coupled gate electrode GE is provided, a barrier for holes is small (low).

Such a semiconductor device of the comparative example has a low threshold voltage, which is close to 0 V, although having normally-off characteristics. Further, when the gate voltage is increased over a threshold value (Vth), a forward bias is applied to a pGaN/AlGaN junction portion and a large gate leakage current (for example, 1 mA or more at a room temperature (25° C.)) flows even when the gate voltage is relatively small (for example, about 3 V) because the gate electrode GE is ohmically coupled to a surface of the p$^+$GaN. When the gate leakage current is large, a large-capacity bootstrap capacitor is required for a gate driver and it is difficult to apply a speed-up capacitor to a gate drive circuit.

On the other hand, according to the semiconductor device (transistor) of the present embodiment, as described above, it is possible to suppress the gate leakage current. Thereby, it is possible to reduce the capacity of the bootstrap capacitor of the gate driver. Further, it is possible to cause the speed-up capacitor of the gate drive circuit to function effectively.

Figure 6:
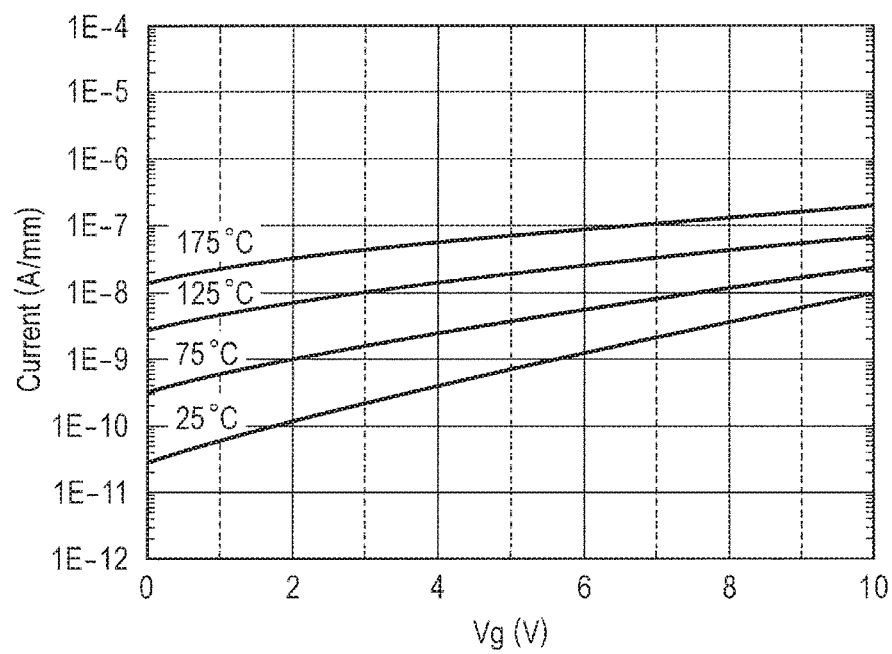
FIG. 6 is a graph showing a relationship between a gate voltage and a gate leakage current.

FIG. 6 is a graph showing a relationship between the gate voltage and the gate leakage current of the semiconductor device of the present embodiment. For example, the first nitride semiconductor layer (buffer layer) S1 is assumed to be AlGaN having a thickness of 1000 nm and an Al concentration of 5%, the second nitride semiconductor layer (channel layer) S2 is assumed to be GaN having a thickness of 30 nm, and the third nitride semiconductor layer (barrier layer) S3 is assumed to be AlGaN having a thickness of 10 nm and an Al concentration of 25%. Further, the mesa type fourth nitride semiconductor layer (cap layer) S4 is assumed to be i-GaN of 60 nm and the first gate electrode GE1 is assumed to be TiN having a Schottky barrier height of 1.0 V. In this case, as shown in FIG. 6, as a gate voltage (Vg, V) indicated by the horizontal axis increases, the gate leakage current (A/mm) per unit gate width indicated by the vertical axis increases. However, it is known that the gate leakage current is 1 μA/mm or less in any environment of 25° C., 75° C., 125° C., and 175° C. For example, the gate leakage current at 175° C. and Vg=5 V is 0.1 μA/mm or less, so that it is known that the gate leakage current is suppressed to a level with no problem for practical use even at a high temperature.

As described above, in the present embodiment, the second gate electrode GE2 is a little larger than the laminated body of the mesa type fourth nitride semiconductor layer (cap layer) S4 and the first gate electrode GE1 (FIGS. 1 and 2). A field plate effect can be obtained by extending the second gate electrode GE2 to the source electrode SE side or the drain electrode DE side in this way. In other words, by extending an edge portion of the second gate electrode GE2 toward the drain side beyond an edge portion of the laminated body of the mesa type fourth nitride semiconductor layer (cap layer) S4 and the first gate electrode GE1, it is possible to alleviate concentration of electric field in the vicinity of the drain side edges of the first and the second gate electrodes GE1 and GE2 when a high voltage is applied to the drain electrode DE. Such an effect is called the field plate effect. Although the field plate effect on the drain side is described here, the field plate effect can also be obtained on the source side. Specifically, by extending an edge portion of the second gate electrode GE2 toward the source side, it is possible to alleviate concentration of electric field in the vicinity of the source side edges of the first and the second gate electrodes GE1 and GE2.

It is preferable that the film thickness of the interlayer insulating film IL1 is thicker than that of the mesa type fourth nitride semiconductor layer (cap layer) S4 (FIG. 1) in order to prevent concentration of electric field at the interlayer insulating film (passivation film) IL1. In particular, it is possible to sufficiently alleviate the concentration of electric field by setting an equivalent insulating film thickness taking the dielectric constant of the interlayer insulating film IL1 into consideration greater than an equivalent insulating film thickness taking the dielectric constant of the mesa type fourth nitride semiconductor layer (cap layer) S4 into consideration.

[Explanation of Manufacturing Method]

Next, a manufacturing method of the semiconductor device of the present embodiment will described with reference to FIGS. 7 to 14 and the configuration of the semiconductor device will be further clarified. FIGS. 7 to 14 are cross-sectional views showing a manufacturing process of the semiconductor device of the present embodiment.

Figure 7:
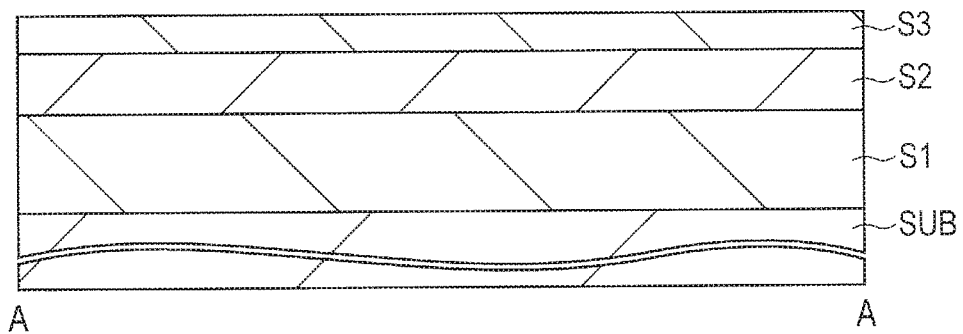
FIG. 7 is a cross-sectional view showing a manufacturing process of the semiconductor device of the first embodiment.

As shown in FIG. 7, the substrate SUB is prepared and the first to the third nitride semiconductor layers are sequentially formed. As the substrate SUB, for example, a semiconductor substrate comprised of silicon (Si) whose (111) surface is exposed is used. As the substrate SUB, it is also possible to use a substrate comprised of SiC, sapphire, or the like instead of the silicon. Further, it is possible to use a substrate comprised of GaN. Normally, all the nitride semiconductor layers (compound semiconductor layers of III-V groups) that will be formed over the substrate SUB are formed by group-III element surface growth (that is, in this case, by gallium surface growth or aluminum surface growth). The first to the third nitride semiconductor layers may be sequentially formed after forming a nucleation layer and a high-resistance buffer layer over the substrate SUB. As the nucleation layer, it is possible to use, for example, an aluminum nitride (AlN) layer. This layer can be formed by, for example, epitaxial growth using a metal organic chemical vapor deposition (MOCVD) method. As the high-resistance buffer layer, a superlattice structure formed by repeatedly laminating a laminated film (AlN/GaN film) of a gallium nitride (GaN) layer and an aluminum nitride (AlN) layer can be used. The superlattice structure can be formed by, for example, alternately epitaxially growing a gallium nitride (GaN) layer and an aluminum nitride (AlN) layer by using the metal organic chemical vapor deposition method.

Next, as the first nitride semiconductor layer (buffer layer) S1, an AlGaN layer is epitaxially grown over the substrate SUB by about 1000 nm by using the metal organic chemical vapor deposition method or the like. When an element composition ratio of the AlGaN layer is $Al_xGa_{1-x}N$, X is 0.05 (Al concentration is 5%). The X can be adjusted within a range from 0 to 0.15 (0≤X≤0.15). The greater the X is, the higher the threshold value can be. The AlGaN layer is, for example, a non-doped layer. In other words, intentional doping of n-type impurity (for example, Si) or p-type impurity (for example, Mg) is not performed.

Next, as the second nitride semiconductor layer (channel layer) S2, a GaN layer is epitaxially grown over the first nitride semiconductor layer S1 by about 30 nm by using the metal organic chemical vapor deposition method or the like. The GaN layer is a non-doped layer. Instead of the GaN layer, an AlGaN layer with an Al concentration of 5% or less may be used.

Next, as the third nitride semiconductor layer (barrier layer) S3, an AlGaN layer is epitaxially grown over the second nitride semiconductor layer S2 by about 60 nm by using the metal organic chemical vapor deposition method or the like. When an element composition ratio of the AlGaN layer is, for example, $Al_yGa_{1-y}N$, Y is 0.25 (Al concentration is 25%). The Y is can be adjusted within a range of more than X and less than 0.4 (X<Y<0.4). The greater the Y is, the higher the concentration of the 2DEG and the more the ON resistance of the transistor can be reduced. However, the greater the Y is, the lower the threshold value is, so that it is preferable that the Y is within the range described above. Although the AlGaN layer is a non-doped layer, the AlGaN layer may be doped with n-type impurity (for example, Si).

Here, the 2DEG (not shown in the drawings) occurs at the interface between the second nitride semiconductor layer (channel layer) S2 and the third nitride semiconductor layer (barrier layer) S3 as described above.

Figure 8:
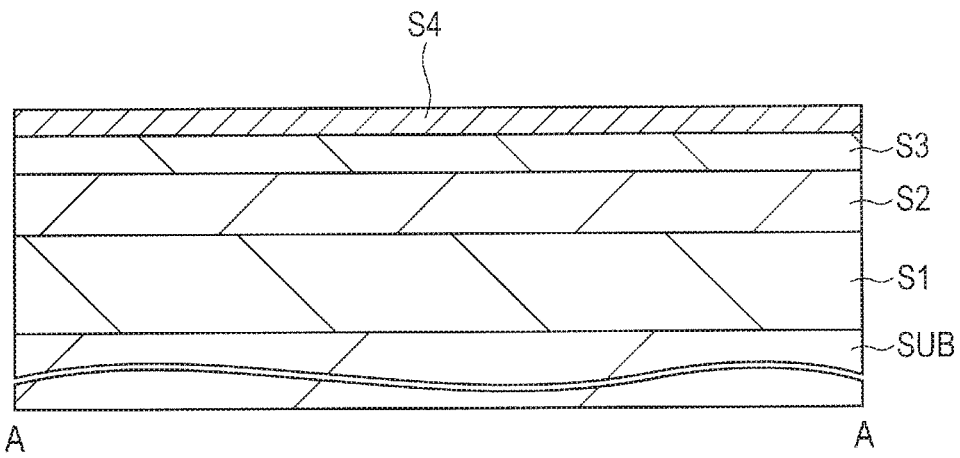
FIG. 8 is a cross-sectional view showing a manufacturing process of the semiconductor device of the first embodiment.

Next, as shown in FIG. 8, as the fourth nitride semiconductor layer (cap layer) S4, a GaN layer is epitaxially grown over the third nitride semiconductor layer S3 by about 60 nm by using the metal organic chemical vapor deposition method or the like. The GaN layer is a non-doped layer. The 2DEG disappears due to film formation of the fourth nitride semiconductor layer (cap layer) S4. The thicker the fourth nitride semiconductor layer (cap layer) S4 is, the higher the threshold value is and the smaller the gate leakage current is. However, on-voltage (a gate voltage required to sufficiently reduce a channel resistance) rises, so that it is preferable that the film thickness of the fourth nitride semiconductor layer (cap layer) S4 is about 10 nm to 200 nm.

Although not shown in FIG. 8, thereafter, an element isolation region is formed by implanting boron ions by using a photoresist film provided over the active region AC as a mask. When ion species such as boron (B) and nitrogen (N) are implanted in this way, a crystalline state changes and an element isolation region whose resistance is increased is formed. A region surrounded by the element isolation region is the active region AC (FIG. 3).

Regarding the first to the fourth nitride semiconductor layers S1 to S4, each layer is grown while introducing, for example, a carrier gas and a raw material gas into the device. As the raw material gas, a gas containing constituent elements of the nitride semiconductor layer (here, the AlGaN layer or the GaN layer) is used. For example, when forming the AlGaN layer, trimethylaluminum (TMAl), trimethylgallium (TMG), and ammonia are used as raw material gases of Al, Ga, and N, respectively. Further, for example, when forming the GaN layer, trimethylgallium (TMG) and ammonia are used as raw material gases of Ga and N, respectively. According to the epitaxial growth method, the element composition ratio of each layer can be easily and accurately adjusted by adjusting a flow rate of the raw material gases. Further, according to the epitaxial growth method, it is possible to easily and continuously form layers of different element configuration by switching the raw material gases. Furthermore, impurities can be easily introduced into the layers.

Figure 9:
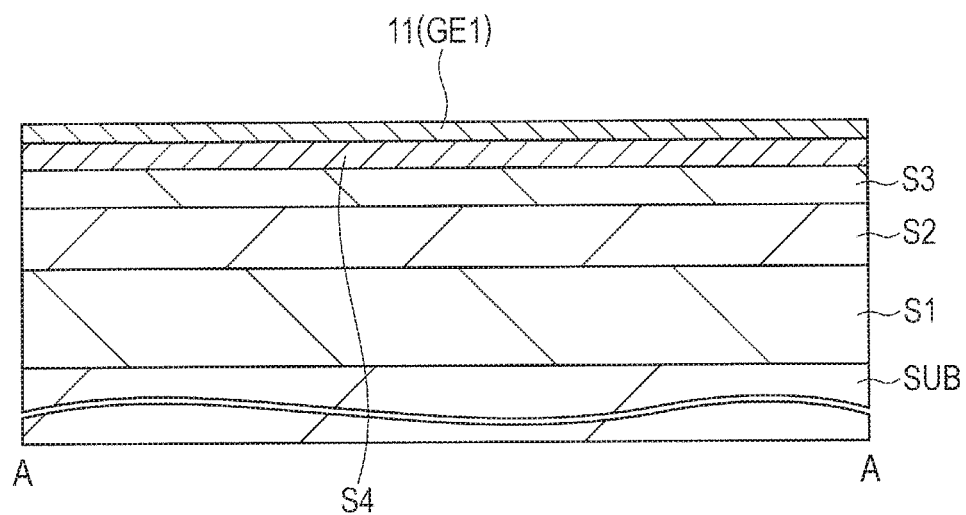
FIG. 9 is a cross-sectional view showing a manufacturing process of the semiconductor device of the first embodiment.

Next, as shown in FIG. 9, a conductive film 11 which will be the first gate electrode GE1 is formed over the fourth nitride semiconductor layer S4. For example, over the fourth nitride semiconductor layer (cap layer) S4, as the conductive film 11 for the first gate electrode GE1, for example, a TiN (titanium nitride) film is deposited with a film thickness of about 30 nm by using a sputtering method or the like. It is preferable that the film thickness of the conductive film (for example, TiN) is 30 nm or more. As the conductive film 11 for the first gate electrode GE1, as described above, a material that is Schottky-joined with the fourth nitride semiconductor layer S4 is used. For example, TiN, Pt, Au, Ni, Pd, or the like, a composite material thereof, an $n^+$ polysilicon, a $p^+$ polysilicon, or the like may be used. In this way, a Schottky junction is formed at an interface between the conductive film 11 for the first gate electrode GE1 and the fourth nitride semiconductor layer (cap layer) S4.

Figure 10:
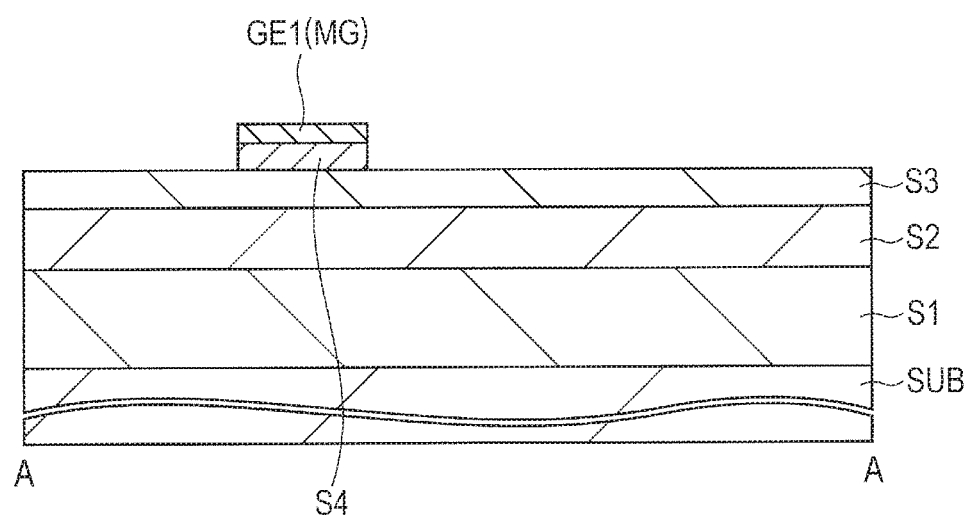
FIG. 10 is a cross-sectional view showing a manufacturing process of the semiconductor device of the first embodiment.

Next, as shown in FIG. 10, a photoresist film (not shown in FIG. 10) is formed in a first gate electrode GE1 forming region by using a photolithography technique, and the first gate electrode GE1 is formed by etching the TiN film by using the photoresist film as a mask. An operation to etch a lower layer by using a film having a desired shape as a mask in this way is called patterning. Specifically, for example, the TiN film is etched by dry etching using a gas whose main component is $Cl_2$. A fluorine-based gas may be used instead of a chlorine-based gas such as $Cl_2$. Alternatively, a mixed gas of a chlorine-based gas and a fluorine-based gas may be used. Next, the fourth nitride semiconductor layer (cap layer) S4 under the first gate electrode (TiN film) GE1 is etched. For example, the fourth nitride semiconductor layer (cap layer) S4 is processed by dry etching using a chlorine-based gas. Thereby, a laminated body of the mesa type fourth nitride semiconductor layer S4 and the first gate electrode GE1 is formed.

At this stage, the mesa type fourth nitride semiconductor layer S4 is partially formed (for example, in a rectangular shape having a long side in the Y direction) over the third nitride semiconductor layer (barrier layer) S3. On the other hand, in exposed portions of the third nitride semiconductor layer S3 on both sides of the mesa type fourth nitride semiconductor layer S4, the fourth nitride semiconductor layer S4 is removed, so that the 2DEG is generated again.

After this, the photoresist film is removed. By the way, after processing the first gate electrode GE1, the photoresist mask may be removed and the fourth nitride semiconductor layer S4 may be etched using the first gate electrode GE1 as a mask.

Figure 11:
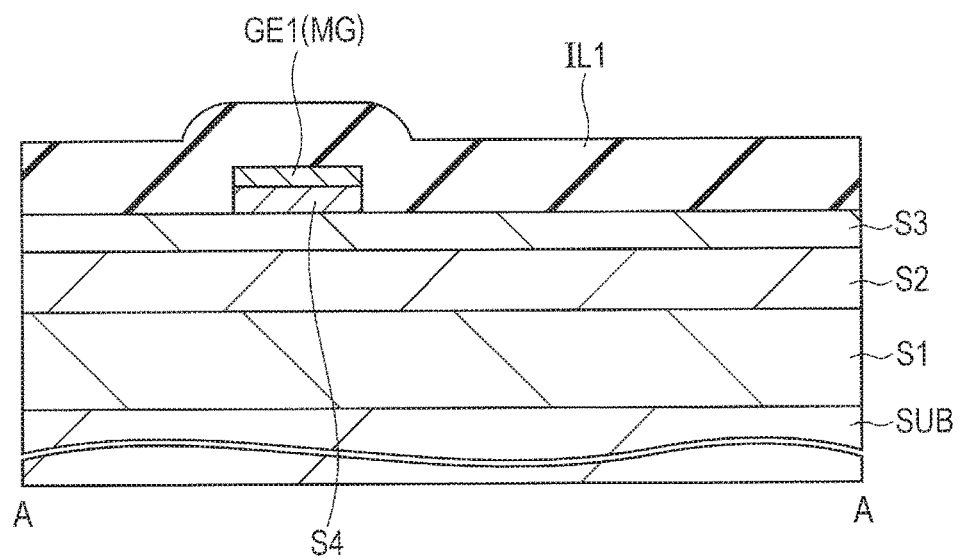
FIG. 11 is a cross-sectional view showing a manufacturing process of the semiconductor device of the first embodiment.
Figure 12:
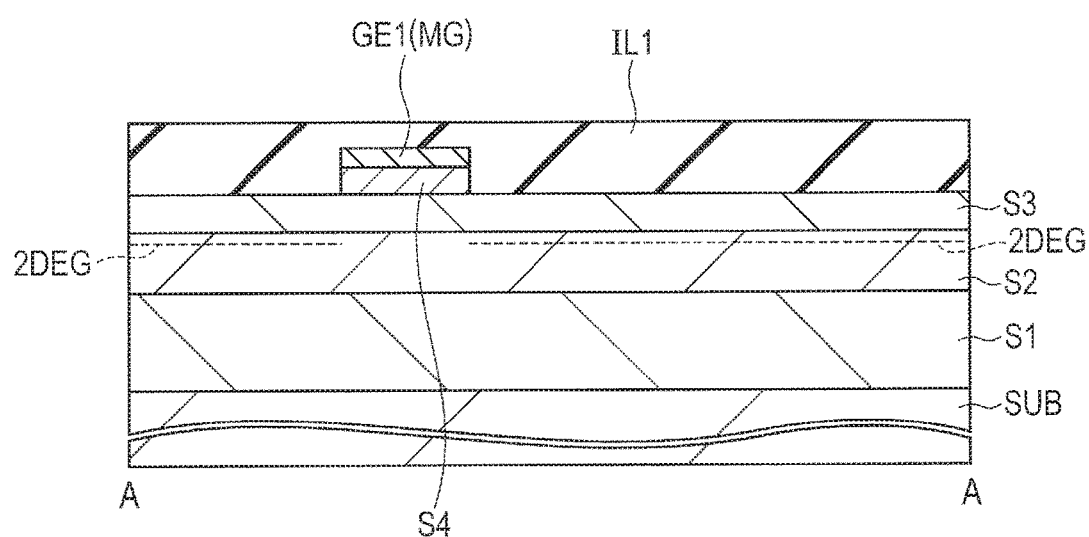
FIG. 12 is a cross-sectional view showing a manufacturing process of the semiconductor device of the first embodiment.

Next, as shown in FIG. 11, the interlayer insulating film IL1 is formed over the first gate electrode GE1. For example, as the interlayer insulating film IL1, a BPSG (boron phospho silicate glass) film is deposited by about 130 nm by using a CVD (chemical vapor deposition) method or the like. Next, a heat treatment (reflow) at about 800° C. is performed to flatten a surface of the BPSG film (FIG. 12). By the way, a silicon nitride film with a film thickness of about 20 nm may be formed under the BPSG film by using a PECVD (plasma-enhanced chemical vapor deposition) method or the like, and the interlayer insulating film IL1 may be a laminated film of the silicon nitride film and the BPSG film over the silicon nitride film. By using the BPSG film as the interlayer insulating film in this way, it is possible to thicken the interlayer insulating film IL1 and improve flatness of the interlayer insulating film IL1. For example, the film thickness of the interlayer insulating film IL1 (for example, 130 nm) is thicker than the film thickness of the fourth nitride semiconductor layer (cap layer) S4.

Figure 13:
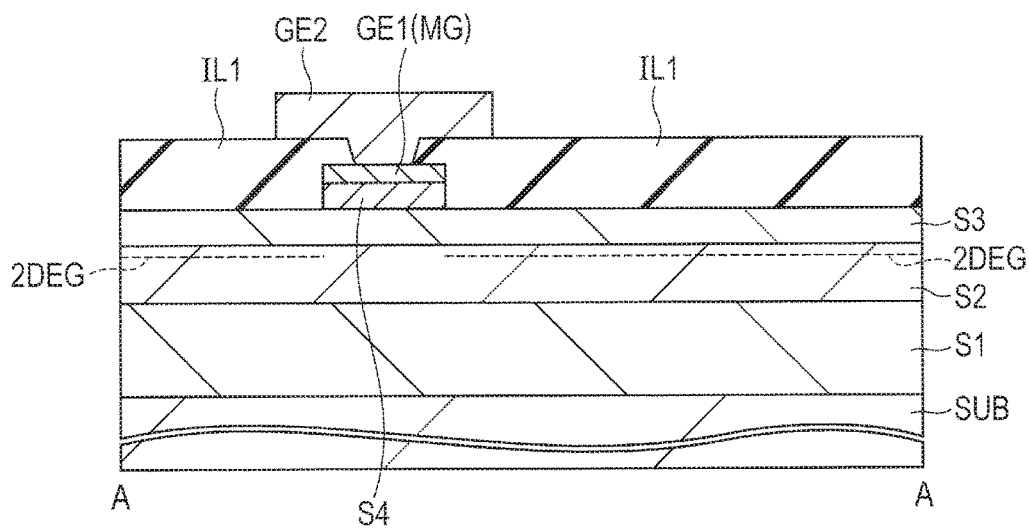
FIG. 13 is a cross-sectional view showing a manufacturing process of the semiconductor device of the first embodiment.

Next, as shown in FIG. 13, the second gate electrode GE2 is formed. First, by using photolithography and an etching technique, the interlayer insulating film IL1 over the first gate electrode GE1 is removed and an opening portion is formed. For example, a photoresist film (not shown in FIG. 13) having an opening portion is formed over the interlayer insulating film IL1 over the first gate electrode GE1. Next, the interlayer insulating film IL1 is etched by using the photoresist film as a mask. For example, the interlayer insulating film IL1 is etched by dry etching using a gas (fluorine-based gas) whose main component is $SF_6$. Thereby, a part of the first gate electrode GE1 is exposed.

Next, over the exposed portion (opening portion) of the first gate electrode GE1 and the interlayer insulating film IL1, as a conductive film for the second gate electrode GE2, for example, an Al film is deposited with a film thickness of about 100 nm by using a sputtering method or the like. It is possible to appropriately adjust constituent materials and the film thickness of the conductive film for the second gate electrode GE2. Next, a photoresist film (not shown in the drawings) is formed in a second gate electrode GE2 forming region by using a photolithography technique, and the second gate electrode GE2 is formed by etching the Al film by using the photoresist film as a mask. In this case, a gate length of the second gate electrode GE2 is set longer than that of the first gate electrode GE1. More specifically, an end portion of the second gate electrode GE2 is extended toward the drain side or the source side more than an end portion of a laminated body of the mesa type fourth nitride semiconductor layer (cap layer) S4 and the first gate electrode GE1. Thereby, as described above, the field plate effect can be obtained. The second gate electrode GE2 may be assumed to be wiring of a first layer.

The interlayer insulating film (BPSG film) IL1 under the second gate electrode GE2 is thickened and the surface of the interlayer insulating film IL1 is flattened, so that it is possible to alleviate an electric field concentrating on the source side or the drain side of the second gate electrode GE2.

Figure 14:
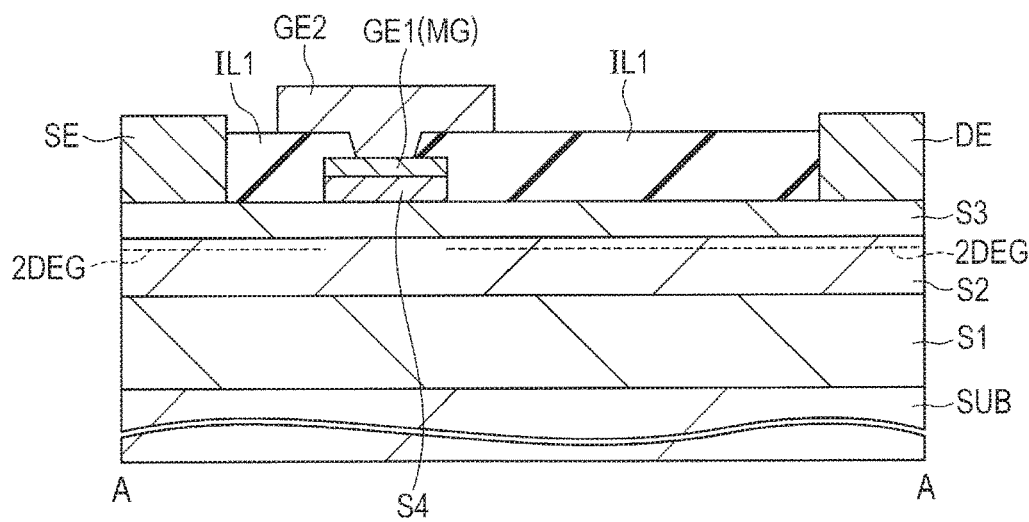
FIG. 14 is a cross-sectional view showing a manufacturing process of the semiconductor device of the first embodiment.

Next, as shown in FIG. 14, the source electrode SE and the drain electrode DE are formed. First, contact holes are formed in the interlayer insulating film IL1 by using photolithography and an etching technique. For example, a photoresist film (not shown in FIG. 14) having an opening portion in each of a source electrode coupling region and a drain electrode coupling region is formed over the interlayer insulating film IL1. Next, the contact holes are formed by etching the interlayer insulating film IL1 by using the photoresist film as a mask. For example, the interlayer insulating film IL1 is etched by dry etching using a gas (fluorine-based gas) whose main component is $SF_6$. Thereby, the third nitride semiconductor layers (barrier layer) S3 in the source electrode coupling region and the drain electrode coupling region located on both sides of the first gate electrode GE1 are exposed.

Next, the source electrode SE and the drain electrode DE are formed in the contact holes and over the interlayer insulating film IL1. For example, a conductive film is formed over the interlayer insulating film IL1 including the inside of the contact holes. For example, an Al/Ti film is formed as the conductive film. For example, a Ti film is formed with a film thickness of about 20 nm by using a sputtering method or the like, and further an Al film is formed with a film thickness of about 2 μm over the Ti film by using a sputtering method or the like. Thereafter, a heat treatment is applied. For example, a heat treatment at 500° C. for 30 minutes is performed. Thereby, it is possible to take an ohmic contact between the conductive film (Al/Ti film) and a layer under the conductive film.

Next, a photoresist film (not shown in FIG. 14) is formed in forming regions of the source electrode SE and the drain electrode DE, and the conductive film (Al/Ti film) is etched by using the photoresist film (not shown in FIG. 14) as a mask. For example, the conductive film (Al/Ti film) is etched by dry etching using a gas whose main component is $Cl_2$.

It is possible to appropriately adjust constituent materials and the film thickness of the conductive film that forms the source electrode SE and the drain electrode DE. As such a conductive film, it is preferable to use a material that is ohmically coupled with (in contact with) a nitride semiconductor layer.

As described above, in the present embodiment, the first gate electrode GE1 and the mesa type fourth nitride semiconductor layer (cap layer) S4 are Schottky-joined, and the source electrode SE or the drain electrode DE and the third nitride semiconductor layer (barrier layer) S3 are ohmically coupled. The ohmic coupling requires the heat treatment as describe above. The Ti film of the conductive film (Al/Ti film) is taken into the Al film after the heat treatment.

Thereafter, an insulating film may be formed over the interlayer insulating film IL1 and over the source electrode SE and the drain electrode DE, and further, wiring may be formed over the insulating film. Furthermore, a protective film composed of an insulating film may be formed over the uppermost wiring.

The semiconductor device of the present embodiment can be formed by the processes described above. The processes described above is an example, and the semiconductor device of the present embodiment may be manufactured by processes other than the processes described above.

Second Embodiment

In the first embodiment described above, the fourth nitride semiconductor layer (cap layer) S4 is a single layer film. However, the fourth nitride semiconductor layer (cap layer) S4 may be a two-layer film. Here, the mesa type fourth nitride semiconductor layer (cap layer) S4 is assumed to be a two-layer film including a non-doped layer (for example, i-GaN) S42$a$ and an n-type layer (for example, nGaN) S42$b$ over the non-doped layer S42$a$.

[Explanation of Structure]

Figure 15:
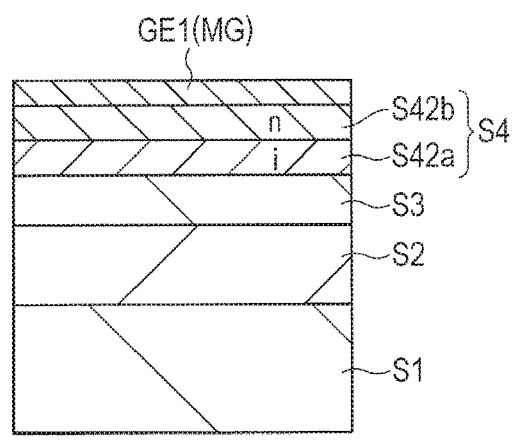
FIG. 15 is a cross-sectional view showing a configuration near a first gate electrode of a semiconductor device of a second embodiment.

The configuration of the semiconductor device of the present embodiment is the same as that of the first embodiment except for the configuration of the fourth nitride semiconductor layer S4 (cap layer). FIG. 15 is a cross-sectional view showing a configuration near a first gate electrode of the semiconductor device (transistor) of the present embodiment.

As shown in FIG. 15, in the semiconductor device of the present embodiment, in the same manner as in the first embodiment, the first nitride semiconductor layer S1, the second nitride semiconductor layer S2, and the third nitride semiconductor layer S3 are sequentially formed over the substrate (SUB). The fourth nitride semiconductor layer S4 is formed over the third nitride semiconductor layer S3, and the first gate electrode GE1 is formed over the fourth nitride semiconductor layer (cap layer) S4.

Here, in the present embodiment, the mesa type fourth nitride semiconductor layer (cap layer) S4 is a laminated film of the non-doped layer (for example, i-GaN) S42$a$ and the n-type layer (for example, nGaN) S42$b$ over the non-doped layer. The n-type layer (for example, nGaN) S42$b$ and the first gate electrode GE1 are Schottky-joined.

Figure 16A:
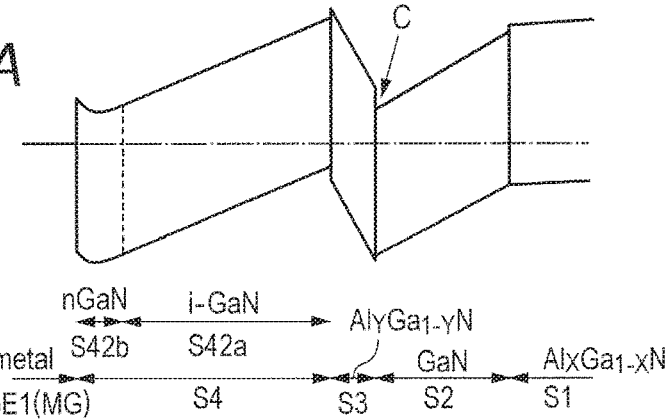
FIGS. 16A to 16C are diagrams showing a band profile near the first gate electrode of the semiconductor device of the second embodiment.
Figure 16B:
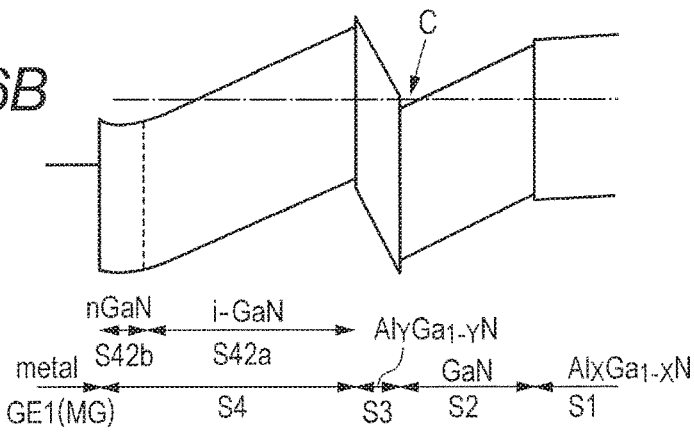
Figure 16C:
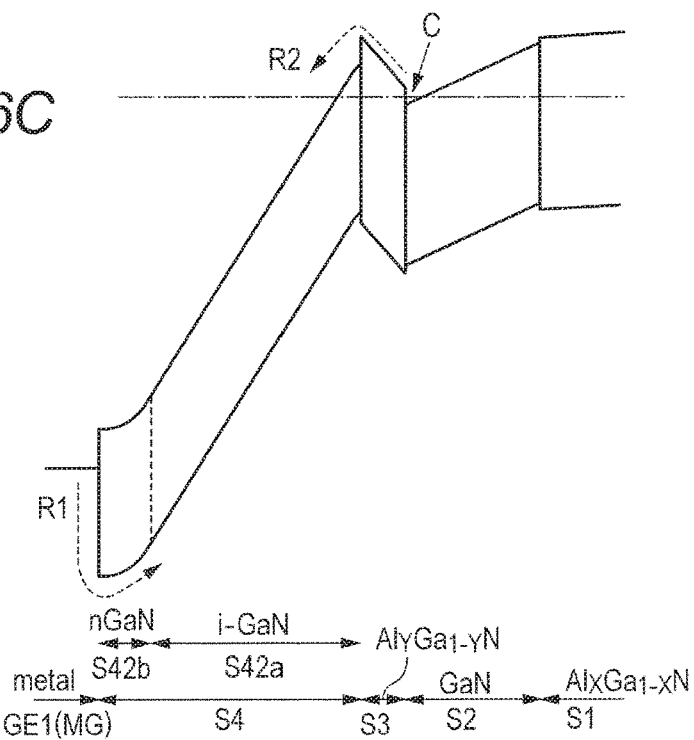

FIGS. 16A to 16C are diagrams showing a band profile near the first gate electrode of the semiconductor device (transistor) of the present embodiment. In FIGS. 16A to 16C, FIG. 16A shows a case where a first gate voltage Vg is 0 V, FIG. 16B shows a case where the first gate voltage Vg is 1.5 V, and FIG. 16C shows a case where the first gate voltage Vg is 8 V. As shown in FIGS. 16A to 16C, when a positive voltage is gradually applied to the first gate electrode from an off state (Vg=0 V) shown in FIG. 16A, a potential at a conduction band end gradually decreases, and when a point C (S3/S2 interface that becomes a channel) where the potential is low reaches the Fermi level (dashed-dotted line), electrons start to accumulate (FIG. 16B). A gate voltage at this time is a threshold value (Vth, for example, 1.5 V), and it is known that the transistor of the present embodiment has normally-off characteristics (Vth>0 V). When a gate voltage higher than the threshold value (Vg>Vth, for example, 8 V) is applied, a potential barrier between the first gate electrode GE1 and the channel is lowered downward on the first gate electrode GE1 side.

Here, also in the present embodiment, the Schottky gate electrode (the first gate electrode GE1) is provided over the mesa type fourth nitride semiconductor layer (cap layer) S4, so that a barrier for the holes (the route R1) increases (rises) and a depletion layer spreads in the mesa type fourth nitride semiconductor layer (cap layer) S4. Therefore, the gate leakage current can be suppressed. Further, due to the first nitride semiconductor layer (buffer layer) S1, a barrier for electrons (the route R2) also increases (rises), so that the gate leakage current can be suppressed.

A part of the mesa type fourth nitride semiconductor layer (cap layer) S4 is a non-doped layer (for example, i-GaN), so that the potential barrier between the first gate electrode GE1 and the channel can be largely lowered downward on the first gate electrode GE1 side and the breakdown voltage can be increased.

Further, in the present embodiment, the n-type layer (for example, nGaN) S42$b$ is provided on the first gate electrode GE1 side, so that a band of the n-type layer S42$b$ has a downward convex shape, and a width of a barrier of the route R1 increases. Therefore, it is possible to reduce the tunneling probability of holes, so that it is possible to more effectively reduce the leakage current.

[Explanation of Manufacturing Method]

The configuration of the semiconductor device of the present embodiment is the same as that of the first embodiment except for the forming process of the fourth nitride semiconductor layer S4 (cap layer).

For example, a laminated film of the non-doped layer (for example, i-GaN) S42$a$ and the n-type layer (for example, nGaN) S42$b$ over the non-doped layer is formed over the third nitride semiconductor layer (barrier layer) S3 as the fourth nitride semiconductor layer (cap layer) S4. For example, a non-doped GaN layer is epitaxially grown by about 50 nm by using the metal organic chemical vapor deposition method or the like, and thereafter a GaN layer is epitaxially grown by about 10 nm by using the metal organic chemical vapor deposition method or the like while doping an n-type impurity (for example, Si). Nd of the non-doped GaN layer (i-GaN) is 1E16 cm$^{-3}$ or less, and Nd of the n-type GaN layer is about 5E18 cm$^{-3}$. Nd means a concentration of impurity in a layer. For example, 1E16 cm$^{-3}$ is $1\times10^{16}$ cm$^{-3}$.

Third Embodiment

In the second embodiment described above, the fourth nitride semiconductor layer (cap layer) S4 is a two-layer film. However, the fourth nitride semiconductor layer S4 (cap layer) may be a three-layer film. Here, the mesa type fourth nitride semiconductor layer (cap layer) S4 is assumed to be a three-layer film including a p-type layer (for example, pGaN) S43$a$, a non-doped layer (for example, i-GaN) S43$b$ over the p-type layer S43$a$, and an n-type layer (for example, nGaN) S43$c$ over the non-doped layer S43$b$.

[Explanation of Structure]

Figure 17:
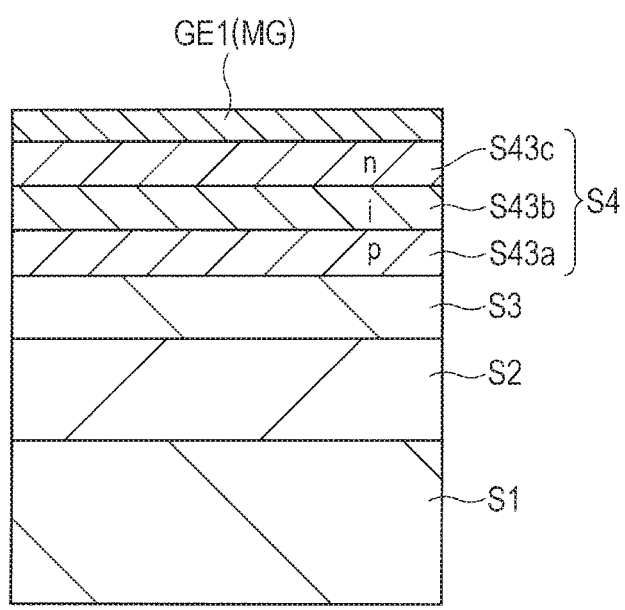
FIG. 17 is a cross-sectional view showing a configuration near a first gate electrode of a semiconductor device of a third embodiment.

The configuration of the semiconductor device of the present embodiment is the same as those of the first and the second embodiments except for the configuration of the fourth nitride semiconductor layer S4 (cap layer). FIG. 17 is a cross-sectional view showing a configuration near a first gate electrode of the semiconductor device (transistor) of the present embodiment.

As shown in FIG. 17, in the semiconductor device of the present embodiment, in the same manner as in the first embodiment, the first nitride semiconductor layer S1, the second nitride semiconductor layer S2, and the third nitride semiconductor layer S3 are sequentially formed over the substrate (SUB). The fourth nitride semiconductor layer S4 is formed over the third nitride semiconductor layer S3, and the first gate electrode GE1 is formed over the fourth nitride semiconductor layer (cap layer) S4.

Here, in the present embodiment, the mesa type fourth nitride semiconductor layer (cap layer) S4 is a laminated film of the p-type layer (for example, pGaN) S43$a$, the non-doped layer (for example, i-GaN) S43$b$ over the p-type layer S43$a$, and the n-type layer (for example, nGaN) S43$c$ over the non-doped layer S43$b$. The n-type layer (for example, nGaN) S43$c$ and the first gate electrode GE1 are Schottky-joined.

Figure 18A:
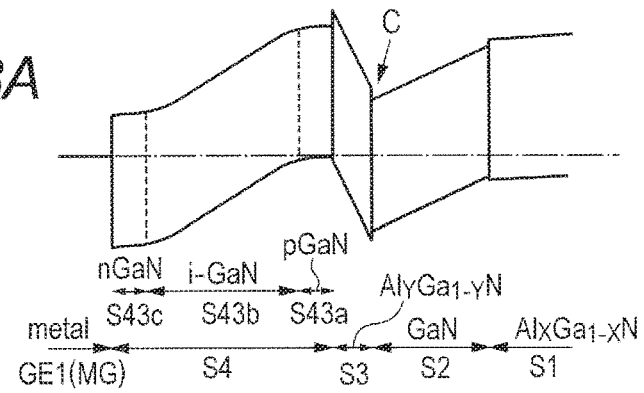
FIGS. 18A to 18C are diagrams showing a band profile near the first gate electrode of the semiconductor device of the third embodiment.
Figure 18B:
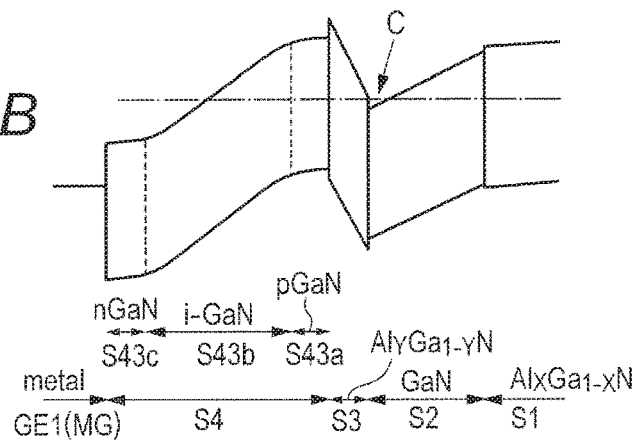
Figure 18C:
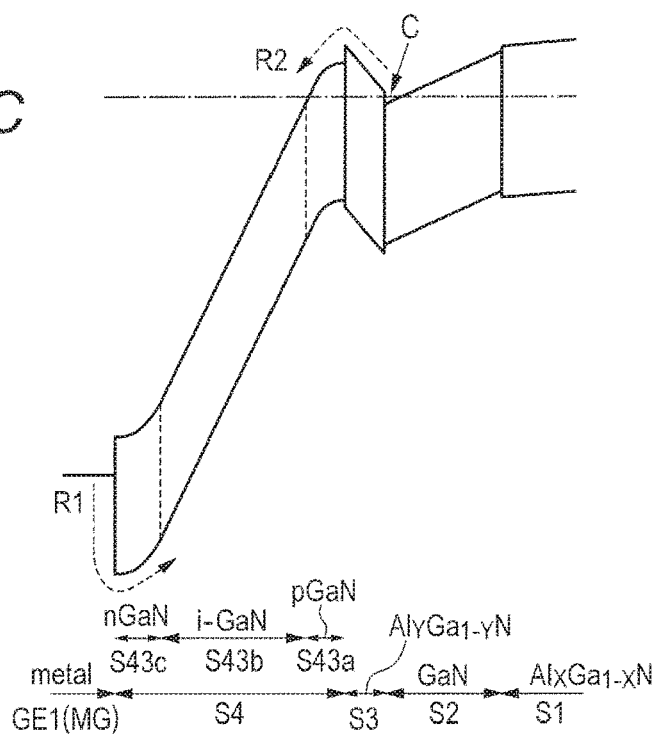

FIGS. 18A to 18C are diagrams showing a band profile near the first gate electrode of the semiconductor device (transistor) of the present embodiment. In FIGS. 18A to 18C, FIG. 18A shows a case where a first gate voltage Vg is 0 V, FIG. 18B shows a case where the first gate voltage Vg is 2 V, and FIG. 18C shows a case where the first gate voltage Vg is 10 V. As shown in FIGS. 18A to 18C, when a positive voltage is gradually applied to the first gate electrode from an off state (Vg=0 V) shown in FIG. 18A, a potential at a conduction band end gradually decreases, and when a point C (S3/S2 interface that becomes a channel) where the potential is low reaches the Fermi level (dashed-dotted line), electrons start to accumulate (FIG. 18B). A gate voltage at this time is a threshold value (Vth, for example, 2 V), and it is known that the transistor of the present embodiment has normally-off characteristics (Vth>0 V). When a gate voltage higher than the threshold value (Vg>Vth, for example, 10 V) is applied, a potential barrier between the first gate electrode GE1 and the channel is lowered downward on the first gate electrode GE1 side.

Here, also in the present embodiment, the Schottky gate electrode (the first gate electrode GE1) is provided over the mesa type fourth nitride semiconductor layer (cap layer) S4, so that a barrier for the holes (the route R1) increases (rises) and a depletion layer spreads in the mesa type fourth nitride semiconductor layer (cap layer) S4. Therefore, the gate leakage current can be suppressed. Further, due to the first nitride semiconductor layer (buffer layer) S1, a barrier for electrons (the route R2) also increases (rises), so that the gate leakage current can be suppressed.

A part of the mesa type fourth nitride semiconductor layer (cap layer) S4 is a non-doped layer (for example, i-GaN), so that the potential barrier between the first gate electrode GE1 and the channel can be largely lowered downward on the first gate electrode GE1 side and the breakdown voltage can be increased.

Further, in the present embodiment, the n-type layer (for example, nGaN) S43$c$ is provided on the first gate electrode GE1 side, so that a band of the n-type layer S43$c$ has a downward convex shape, and a width of a barrier of the route R1 increases. Therefore, it is possible to reduce the tunneling probability of holes, so that it is possible to more effectively reduce the leakage current. Further, in the present embodiment, the p-type layer (for example, pGaN) S43$a$ is provided on the third nitride semiconductor layer (barrier layer) S3 side, so that a band of the p-type layer S43$a$ has an upward convex shape and a width of a barrier of the route R2 increases. Therefore, it is possible to reduce the tunneling probability of electrons, so that it is possible to more effectively reduce the leakage current.

In the present embodiment, curves of the bands of the p-type layer S43a and the n-type layer S43c offset each other, so that a potential (threshold value) where electrons start to accumulate at the point C is about 2 V in the same manner as in the first embodiment.

[Explanation of Manufacturing Method]

The configuration of the semiconductor device of the present embodiment is the same as that of the first embodiment except for the forming process of the fourth nitride semiconductor layer S4 (cap layer).

For example, a laminated film of the p-type layer (for example, pGaN) S43a, the non-doped layer (for example, i-GaN) S43b over the p-type layer S43a, and the n-type layer (for example, nGaN) S43c over the non-doped layer S43b is formed over the third nitride semiconductor layer S3 as the fourth nitride semiconductor layer (cap layer) S4. For example, a GaN layer is epitaxially grown by about 10 nm by using the metal organic chemical vapor deposition method or the like while doping a p-type impurity (for example, Mg), and then a non-doped GaN layer is epitaxially grown by about 50 nm by using the metal organic chemical vapor deposition method or the like, and thereafter a GaN layer is epitaxially grown by about 10 nm by using the metal organic chemical vapor deposition method or the like while doping an n-type impurity (for example, Si). Nd of the p-type GaN layer is about $1E18$ $cm^{-3}$, Nd of the non-doped GaN layer (i-GaN) is $1E16$ $cm^{-3}$ or less, and Nd of the n-type GaN layer is about $1E18$ $cm^{-3}$.

Fourth Embodiment

In the third embodiment described above, the fourth nitride semiconductor layer (cap layer) S4 is a three-layer film. However, the fourth nitride semiconductor layer S4 (cap layer) may be a four-layer film. Here, the fourth nitride semiconductor layer (cap layer) S4 is assumed to be a four-layer film including a non-doped layer (for example, i-GaN) S44a, a p-type layer (for example, pGaN) S44b over the non-doped layer S44a, a non-doped layer (for example, i-GaN) S44c over the p-type layer S44b, and an n-type layer (for example, nGaN) S44d over the non-doped layer S44c. In this way, the p-type layer may be sandwiched by the non-doped layers. [Explanation of Structure]

Figure 19:
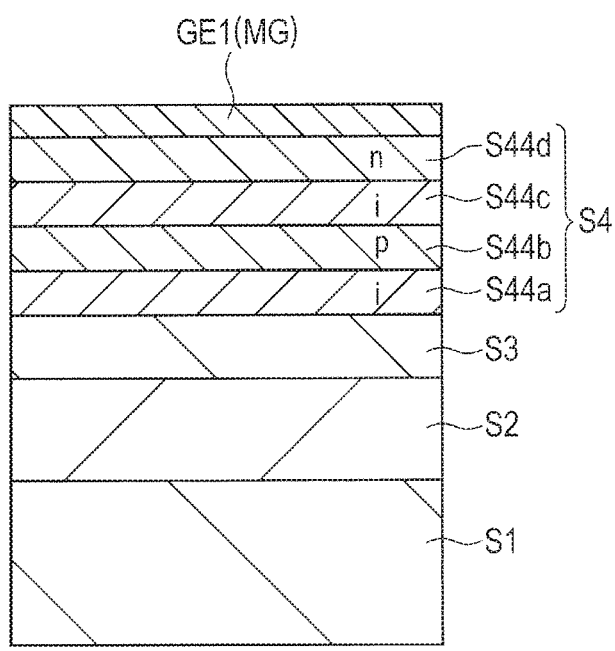
FIG. 19 is a cross-sectional view showing a configuration near a first gate electrode of a semiconductor device of a fourth embodiment.

The configuration of the semiconductor device of the present embodiment is the same as those of the first to the third embodiments except for the configuration of the fourth nitride semiconductor layer S4 (cap layer). FIG. 19 is a cross-sectional view showing a configuration near a first gate electrode of the semiconductor device (transistor) of the present embodiment.

As shown in FIG. 19, in the semiconductor device of the present embodiment, in the same manner as in the first embodiment, the first nitride semiconductor layer S1, the second nitride semiconductor layer S2, and the third nitride semiconductor layer S3 are sequentially formed over the substrate (SUB). The fourth nitride semiconductor layer S4 is formed over the third nitride semiconductor layer S3, and the first gate electrode GE1 is formed over the fourth nitride semiconductor layer (cap layer) S4.

Here, in the present embodiment, the mesa type fourth nitride semiconductor layer (cap layer) S4 is a laminated film of the non-doped layer (for example, i-GaN) S44a, the p-type layer (for example, pGaN) S44b over the non-doped layer S44a, the non-doped layer (for example, i-GaN) S44c over the p-type layer S44b, and the n-type layer (for example, nGaN) S44d over the non-doped layer S44c. The n-type layer (for example, nGaN) S44d and the first gate electrode GE1 are Schottky-joined.

Figure 20A:
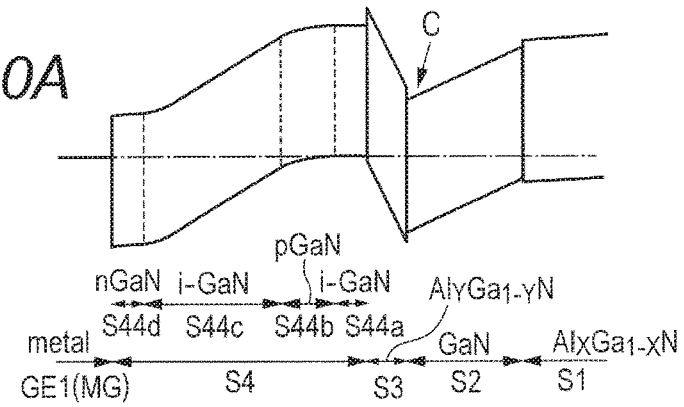
FIGS. 20A to 20C are diagrams showing a band profile near the first gate electrode of the semiconductor device of the fourth embodiment.
Figure 20B:
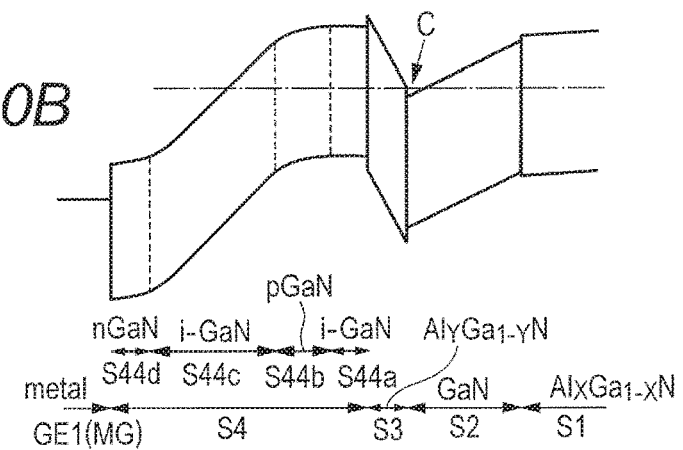
Figure 20C:
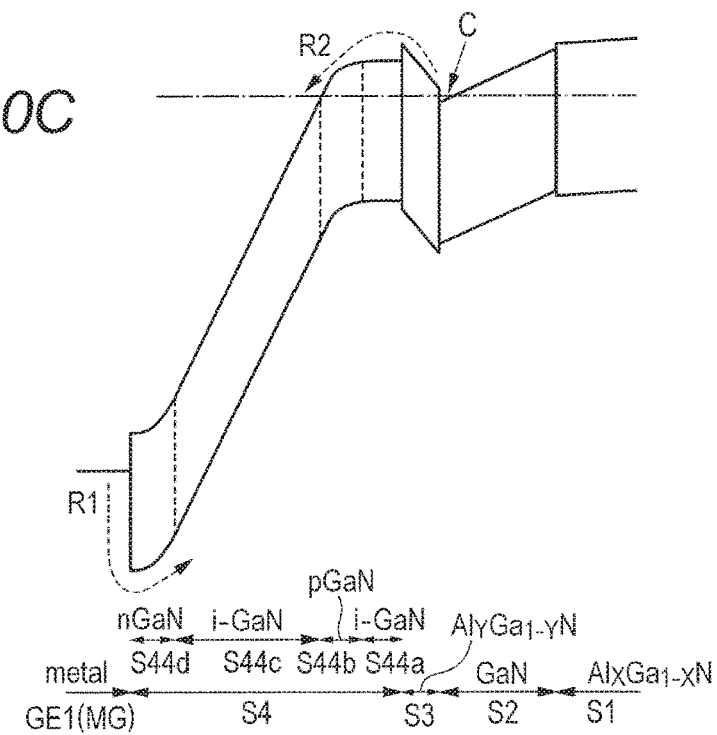

FIGS. 20A to 20C are diagrams showing a band profile near the first gate electrode of the semiconductor device (transistor) of the present embodiment. In FIGS. 20A to 20C, FIG. 20A shows a case where a first gate voltage Vg is 0 V, FIG. 20B shows a case where the first gate voltage Vg is 3 V, and FIG. 20C shows a case where the first gate voltage Vg is 10 V. As shown in FIGS. 20A to 20C, when a positive voltage is gradually applied to the first gate electrode from an off state (Vg=0 V) shown in FIG. 20A, a potential at a conduction band end gradually decreases, and when a point C (S3/S2 interface that becomes a channel) where the potential is low reaches the Fermi level (dashed-dotted line), electrons start to accumulate (FIG. 20B). A gate voltage at this time is a threshold value (Vth, for example, 3 V), and it is known that the transistor of the present embodiment has normally-off characteristics (Vth>0 V). When a gate voltage higher than the threshold value (Vg>Vth, for example, 10 V) is applied, a potential barrier between the first gate electrode GE1 and the channel is lowered downward on the first gate electrode GE1 side.

Here, also in the present embodiment, the Schottky gate electrode (the first gate electrode GE1) is provided over the mesa type fourth nitride semiconductor layer (cap layer) S4, so that a barrier for the holes (the route R1) increases (rises) and a depletion layer spreads in the mesa type fourth nitride semiconductor layer (cap layer) S4. Therefore, the gate leakage current can be suppressed. Further, due to the first nitride semiconductor layer (buffer layer) S1, a barrier for electrons (the route R2) also increases (rises), so that the gate leakage current can be suppressed.

A part of the mesa type fourth nitride semiconductor layer (cap layer) S4 is a non-doped layer (for example, i-GaN), so that the potential barrier between the first gate electrode GE1 and the channel can be largely lowered downward on the first gate electrode GE1 side and the breakdown voltage can be increased.

Further, in the present embodiment, the n-type layer (for example, nGaN) S44d is provided on the first gate electrode GE1 side, so that a band of the n-type layer S44d has a downward convex shape, and a width of a barrier of the route R1 increases. Therefore, it is possible to reduce the tunneling probability of holes, so that it is possible to more effectively reduce the leakage current. Further, in the present embodiment, the p-type layer (for example, pGaN) S44b is provided on the third nitride semiconductor layer (barrier layer) S3 side, so that a band of the p-type layer S44b has an upward convex shape and a width of a barrier of the route R2 increases. Therefore, it is possible to reduce the tunneling probability of electrons, so that it is possible to more effectively reduce the leakage current.

In addition, in the present embodiment, a non-doped layer is provided under the p-type layer S44b, so that it is possible to suppress diffusion of p-type impurity to the AlGaN barrier layer S3 and suppress degradation of mobility of two-dimensional electron gas.

[Explanation of Manufacturing Method]

The configuration of the semiconductor device of the present embodiment is the same as that of the first embodiment except for the forming process of the fourth nitride semiconductor layer S4 (cap layer).

For example, a laminated film of the non-doped layer (for example, i-GaN) S44a, the p-type layer (for example, pGaN) S44b over the non-doped layer S44a, the non-doped layer (for example, i-GaN) S44c over the p-type layer S44b, and the n-type layer (for example, nGaN) S44d over the non-doped layer S44c is formed over the third nitride semiconductor layer S3 as the fourth nitride semiconductor layer (cap layer) S4.

For example, a non-doped GaN layer is epitaxially grown by about 10 nm by using the metal organic chemical vapor deposition method or the like, and thereafter a GaN layer is epitaxially grown by about 10 nm by using the metal organic chemical vapor deposition method or the like while doping a p-type impurity (for example, Mg). Next, a non-doped GaN layer is epitaxially grown by about 50 nm by using the metal organic chemical vapor deposition method or the like, and thereafter a GaN layer is epitaxially grown by about 10 nm by using the metal organic chemical vapor deposition method or the like while doping an n-type impurity (for example, Si). Nd of the p-type GaN layer is about 1E18 $cm^{-3}$. In the non-doped GaN layers (i-GaN) with a thickness of about 10 nm over and under the p-type GaN layer, Nd is about 1E16 to 1E17 $cm^{-3}$ even in a diffusion region of p-type impurity (for example, Mg). Nd of the n-type GaN layer is about 1E18 $cm^{-3}$.

In this way, Nd of the non-doped GaN layers (i-GaN) with a thickness of about 10 nm over and under the p-type GaN layer is set to about 1E16 to 1E17 $cm^{-3}$, so that it is possible to maintain the mobility of two-dimensional electron gas of the S3/S2 interface at 1500 $cm^2/Vsec$ that is similar to that in the first embodiment.

Fifth Embodiment

In the present embodiment, the fourth nitride semiconductor layer S4 (cap layer) is a two-layer film including a non-doped layer and a p-type layer formed over the non-doped layer.

[Explanation of Structure]

Figure 21:
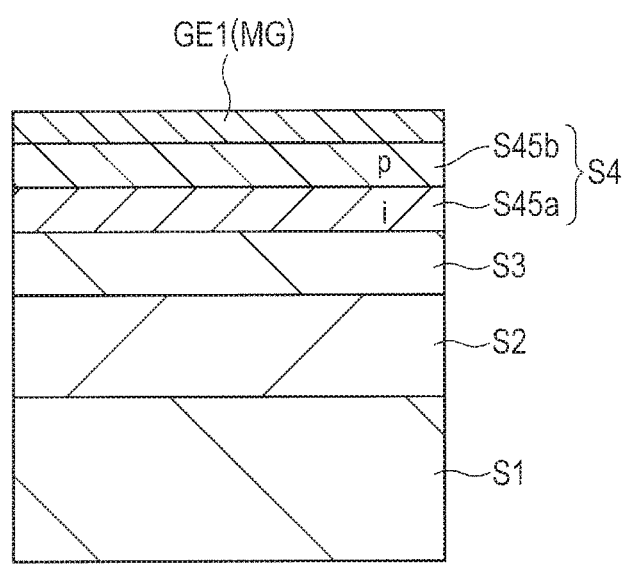
FIG. 21 is a cross-sectional view showing a configuration near a first gate electrode of a semiconductor device of a fifth embodiment.

The configuration of the semiconductor device of the present embodiment is the same as that of the first embodiment except for the configuration of the fourth nitride semiconductor layer S4 (cap layer). FIG. 21 is a cross-sectional view showing a configuration near a first gate electrode of the semiconductor device (transistor) of the present embodiment.

As shown in FIG. 21, in the semiconductor device of the present embodiment, in the same manner as in the first embodiment, the first nitride semiconductor layer S1, the second nitride semiconductor layer S2, and the third nitride semiconductor layer S3 are sequentially formed over the substrate (SUB). The fourth nitride semiconductor layer S4 is formed over the third nitride semiconductor layer S3, and the first gate electrode GE1 is formed over the fourth nitride semiconductor layer (cap layer) S4.

Here, in the present embodiment, the mesa type fourth nitride semiconductor layer (cap layer) S4 is a laminated film of the non-doped layer (for example, i-GaN) S45a and the p-type layer (for example, pGaN) S45b over the non-doped layer. The p-type layer (for example, pGaN) S45b and the first gate electrode GE1 are Schottky-joined.

Figure 22A:
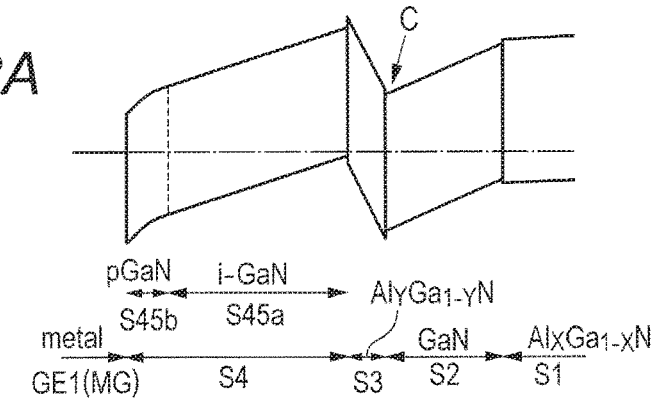
FIGS. 22A to 22C are diagrams showing a band profile near the first gate electrode of the semiconductor device of the fifth embodiment.
Figure 22B:
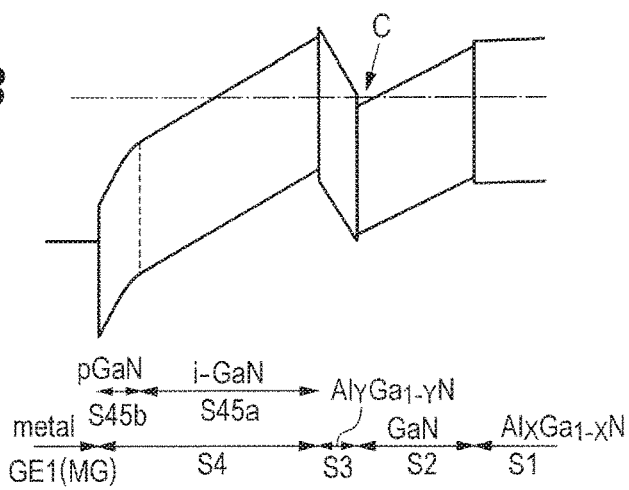
Figure 22C:
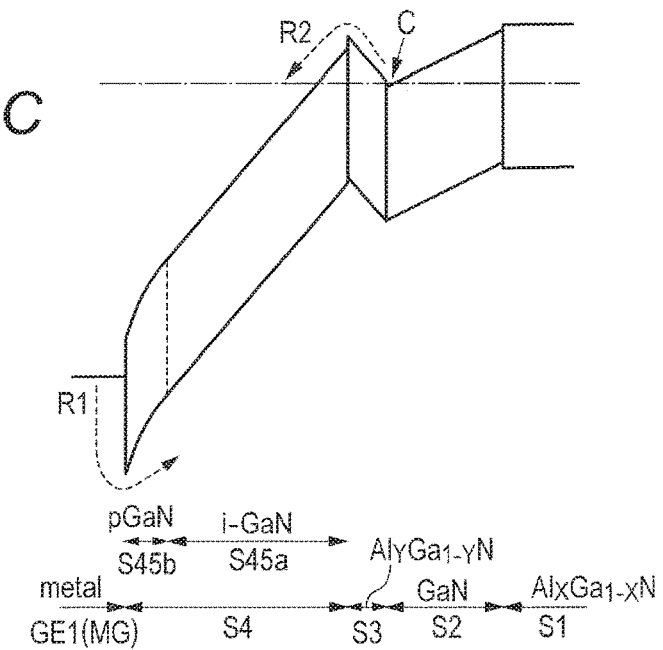

FIGS. 22A to 22C are diagrams showing a band profile near the first gate electrode of the semiconductor device (transistor) of the present embodiment. In FIGS. 22A to 22C, FIG. 22A shows a case where a first gate voltage Vg is 0 V, FIG. 22B shows a case where the first gate voltage Vg is 3 V, and FIG. 22C shows a case where the first gate voltage Vg is 10 V. As shown in FIGS. 22A to 22C, when a positive voltage is gradually applied to the first gate electrode from an off state (Vg=0 V) shown in FIG. 22A, a potential at a conduction band end gradually decreases, and when a point C (S3/S2 interface that becomes a channel) where the potential is low reaches the Fermi level (dashed-dotted line), electrons start to accumulate (FIG. 22B). A gate voltage at this time is a threshold value (Vth, for example, 3 V), and it is known that the transistor of the present embodiment has normally-off characteristics (Vth>0 V). When a gate voltage higher than the threshold value (Vg>Vth, for example, 10 V) is applied, electron density at the point C increases, a channel is formed, and an ON state is completely established. In this case, mobility of electrons increases to, for example, 1500 $cm^2/Vsec$ or more, and the resistance of the channel becomes low.

Also in the present embodiment, the Schottky gate electrode (the first gate electrode GE1) is provided over the mesa type fourth nitride semiconductor layer (cap layer) S4, so that a barrier for the holes (the route R1) increases (rises), so that the gate leakage current can be suppressed. Further, due to the first nitride semiconductor layer (buffer layer) S1, a barrier for electrons (the route R2) also increases (rises), so that the gate leakage current can be suppressed.

Furthermore, a part of the mesa type fourth nitride semiconductor layer (cap layer) S4 is a non-doped layer (for example, i-GaN), so that the potential barrier between the first gate electrode GE1 and the channel can be largely lowered downward on the first gate electrode GE1 side and the breakdown voltage can be increased.

However, in the present embodiment, the p-type layer (for example, pGaN) S45b is provided on the first gate electrode GE1 side, so that the band has an upward convex shape and a width of a barrier slightly decreases. However, a barrier for the holes increases (rises) because the Schottky gate electrode (the first gate electrode GE1) is provided, so that it is possible to reduce the leakage current.

For example, the first nitride semiconductor layer (buffer layer) S1 is assumed to be AlGaN having a thickness of 1000 nm and an Al concentration of 5%, the second nitride semiconductor layer (channel layer) S2 is assumed to be GaN having a thickness of 30 nm, and the third nitride semiconductor layer (barrier layer) S3 is assumed to be AlGaN having a thickness of 10 nm and an Al concentration of 25%. Further, the mesa type fourth nitride semiconductor layer (cap layer) S4 is assumed to be a laminated film of i-GaN of 50 nm and pGaN of 10 nm over the i-GaN, and the first gate electrode GE1 is assumed to be TiN having a Schottky barrier height of 1.0 V. In this case, the threshold value is about 4 V. A bandgap of the pGaN is 3.4 eV. Also in this structure, the potential barrier of the route R1 is sufficiently high and thick, so that even when Vg=8 V at which the transistor becomes a complete ON state, a barrier height of 1 V or more remains (FIG. 22C), the gate leakage current is sufficiently small. For example, the leakage current at T=175° C. and Vg=8 V is 0.1 µA/mm or less, so that the leakage current is suppressed to a level having no problem in practical use even at high temperatures.

[Explanation of Manufacturing Method]

The configuration of the semiconductor device of the present embodiment is the same as that of the first embodiment except for the forming process of the fourth nitride semiconductor layer S4 (cap layer).

For example, a laminated film of the non-doped layer (for example, i-GaN) S45a and the p-type layer (for example, pGaN) S45b over the non-doped layer is formed over the third nitride semiconductor layer S3 as the fourth nitride semiconductor layer (cap layer) S4. For example, a non-doped GaN layer is epitaxially grown by about 50 nm by using the metal organic chemical vapor deposition method or the like, and thereafter a GaN layer is epitaxially grown by about 10 nm by using the metal organic chemical vapor deposition method or the like while doping a p-type impurity (for example, Mg). Nd of the non-doped GaN layer (i-GaN) is 1E16 cm$^{-3}$ or less, and Nd of the p-type GaN layer is about 1E19 cm$^{-3}$.

Sixth Embodiment

Figure 23:
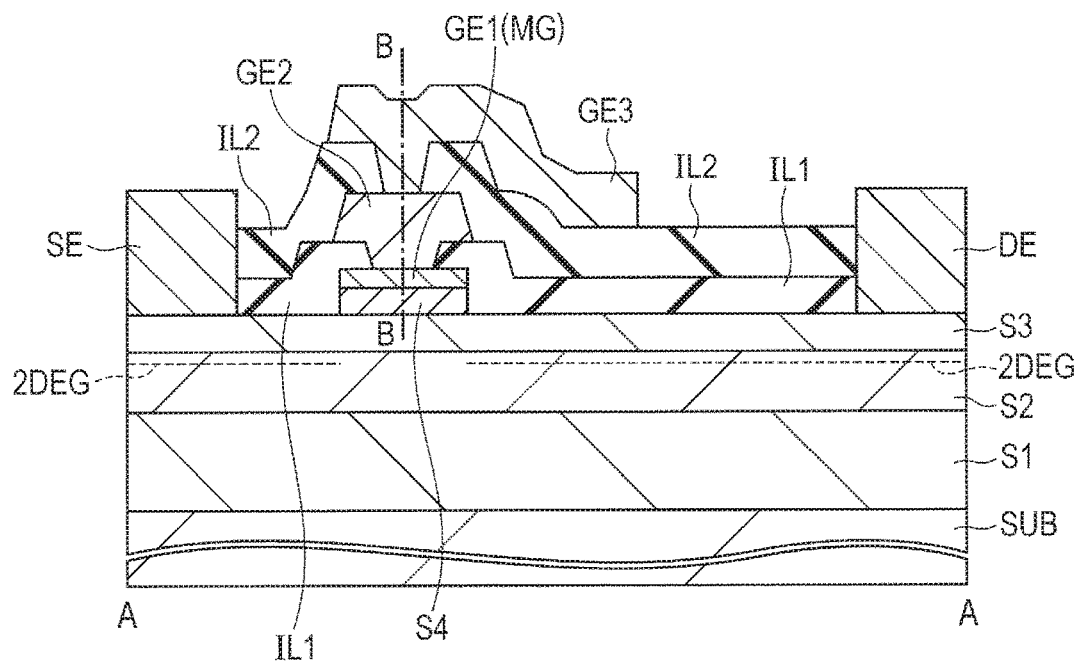
FIG. 23 is a cross-sectional view showing a configuration of a semiconductor device of a sixth embodiment.
Figure 24:
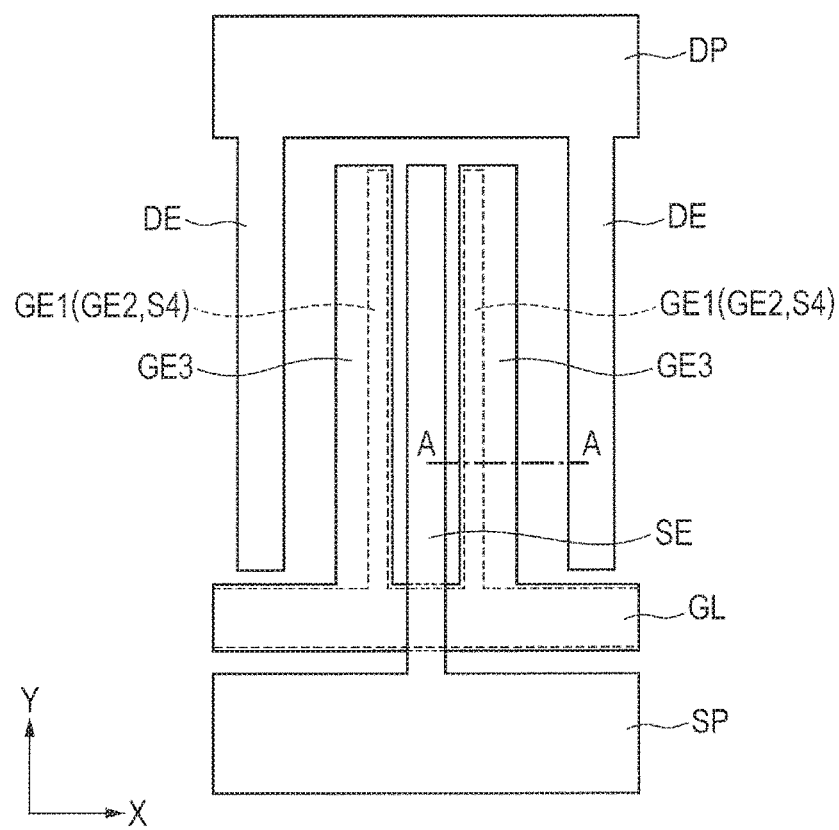
FIG. 24 is a plan view showing a configuration of the semiconductor device of the sixth embodiment.

In the present embodiment, first to third electrodes are provided, and an interlayer insulating film has two layers (IL1 and IL2).
[Explanation of Structure]
Regarding the configuration of the semiconductor device of the present embodiment, a configuration from the substrate SUB to the first gate electrode GE1 is the same as that of the first embodiment. FIG. 23 is a cross-sectional view showing a configuration of the semiconductor device of the present embodiment. FIG. 24 is a plan view showing a configuration of the semiconductor device of the present embodiment.

As shown in FIG. 23, in the semiconductor device of the present embodiment, in the same manner as in the first embodiment, the first nitride semiconductor layer S1, the second nitride semiconductor layer S2, and the third nitride semiconductor layer S3 are sequentially formed over the substrate (SUB). The fourth nitride semiconductor layer S4 is formed over the third nitride semiconductor layer S3, and the first gate electrode GE1 is formed over the fourth nitride semiconductor layer (cap layer) S4.

An interlayer insulating film IL1 is formed over the first gate electrode GE1. Further, a second gate electrode GE2 is formed over the first gate electrode GE1 through an opening portion of the interlayer insulating film IL1. In addition, an interlayer insulating film IL2 is formed over the second gate electrode GE2, and a third gate electrode GE3 is formed over the second gate electrode GE2 through an opening portion of the interlayer insulating film IL2.

A source electrode SE and a drain electrode DE are formed over the third nitride semiconductor layer (barrier layer) S3 and on both sides of the mesa type fourth nitride semiconductor layer (cap layer) S4. For example, contact holes (coupling holes) are formed in the interlayer insulating films IL1 and IL2, and the source electrode SE and the drain electrode DE are arranged inside and above the contact holes.

Here, in the present embodiment, the size of the second gate electrode GE2 is substantially the same as the size of a laminated body of the mesa type fourth nitride semiconductor layer (cap layer) S4 and the first gate electrode GE1, and a planar shape of the second gate electrode GE2 is a rectangular shape having a long side in the Y direction (FIG. 24). The third gate electrode GE3 is larger than the laminated body of the mesa type fourth nitride semiconductor layer (cap layer) S4 and the first gate electrode GE1, and a planar shape of the third gate electrode GE3 is a rectangular shape having a long side in the Y direction. Here, the third gate electrode GE3 more largely extends toward the drain electrode DE than the first gate electrode GE1 (FIG. 24).

As described above, in the present embodiment, the third gate electrode GE3 is drawn out over the interlayer insulating film IL2 through the second gate electrode GE2 and is further extended toward the drain electrode DE. The field plate effect can be obtained by the configuration as described above. Further, in the present embodiment, the interlayer insulating films (IL1 and IL2) form a multi-layer structure, so that it is possible to thicken the interlayer insulating films IL1 and IL2 located under the third gate electrode GE3. Therefore, it is possible to alleviate concentration of electric field in the vicinity of the drain side edges of the first, the second, and the third gate electrodes GE1, GE2, and GE3 when a high voltage is applied to the drain electrode DE.

Here, the third gate electrode GE3 is more largely extended toward the drain electrode DE than the first gate electrode GE1. However, the third gate electrode GE3 may be extended toward the source electrode SE.
[Explanation of Manufacturing Method]
Next, a manufacturing method of the semiconductor device of the present embodiment will described with reference to FIGS. 25 to 29 and the configuration of the semiconductor device will be further clarified. FIGS. 25 to 29 are cross-sectional views showing a manufacturing process of the semiconductor device of the present embodiment.

Figure 25:
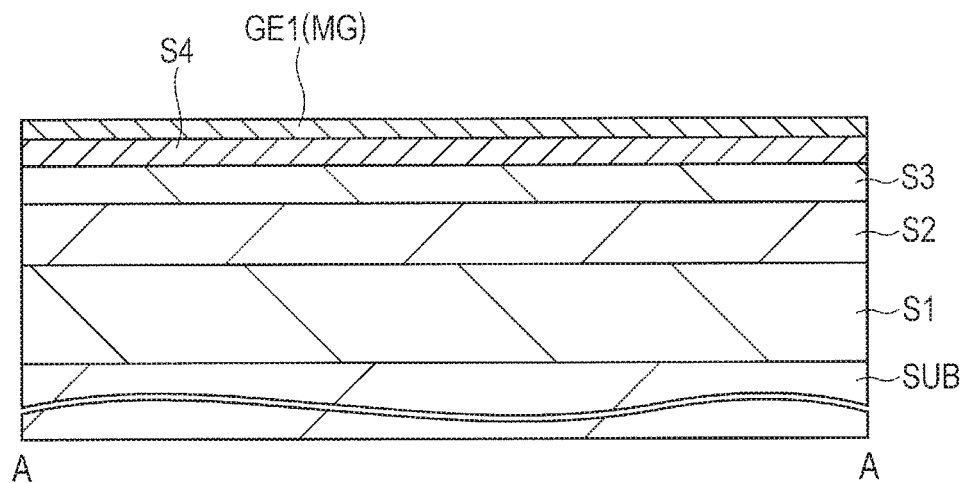
FIG. 25 is a cross-sectional view showing a manufacturing process of the semiconductor device of the sixth embodiment.

As shown in FIG. 25, the substrate SUB is prepared, the first to the fourth nitride semiconductor layers are sequentially formed, and a conductive film which will be the first gate electrode GE1 is formed over the fourth nitride semiconductor layer S4. For the substrate SUB, the same material as that used in the first embodiment can be used. For the first to the fourth nitride semiconductor layers and the conductive film, the same materials as those used in the first embodiment can be used. The first to the fourth nitride semiconductor layers and the conductive film can be formed in the same manner as in the first embodiment.

Figure 26:
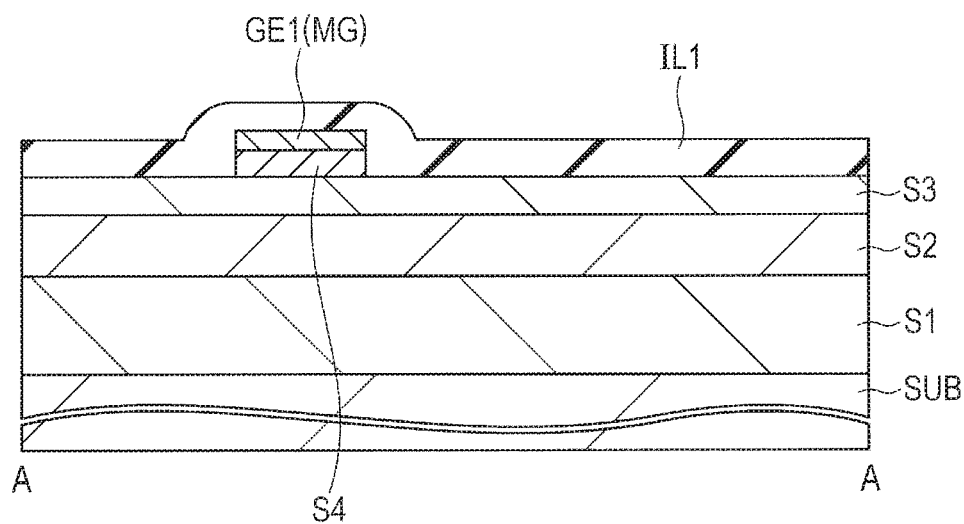
FIG. 26 a cross-sectional view showing a manufacturing process of the semiconductor device of the first embodiment.

Next, as shown in FIG. 26, a laminated body of the mesa type fourth nitride semiconductor layer S4 and the first gate electrode GE1 is formed by patterning the conductive film and the fourth nitride semiconductor layer (cap layer) S4 under the conductive film. The laminated body can be formed in the same manner as in the first embodiment.

Next, the interlayer insulating film IL1 is formed over the first gate electrode GE1. For example, as the interlayer insulating film IL1, a silicon nitride film with a film thickness of about 100 nm is formed by using the PECVD method or the like.

Figure 27:
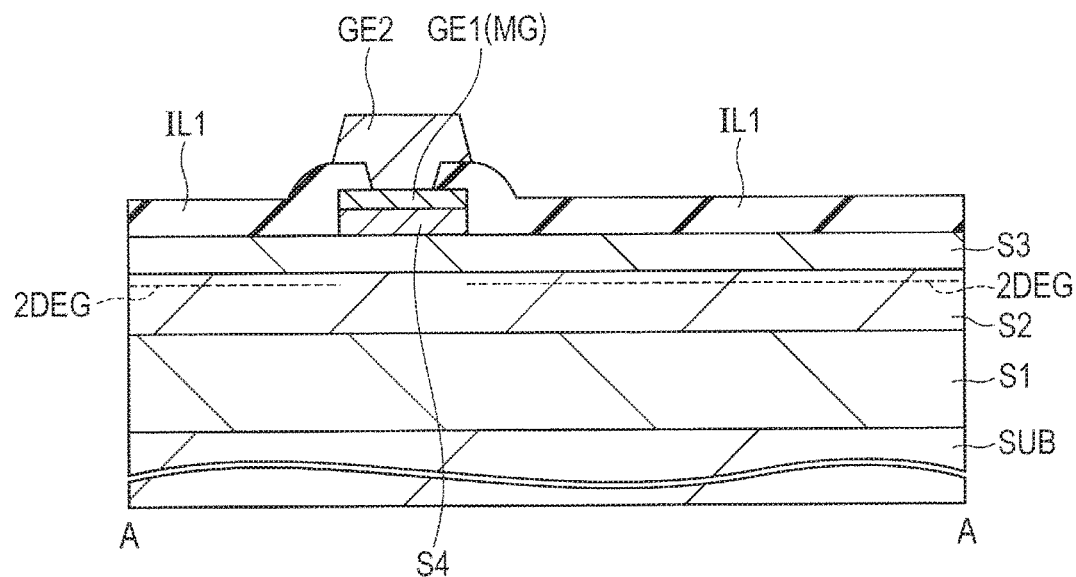
FIG. 27 a cross-sectional view showing a manufacturing process of the semiconductor device of the first embodiment.

Next, as shown in FIG. 27, the second gate electrode GE2 is formed. First, by using photolithography and an etching technique, the interlayer insulating film IL1 over the first gate electrode GE1 is removed and an opening portion is formed. For example, a photoresist film (not shown in FIG. 27) having an opening portion is formed over the interlayer insulating film IL1 over the first gate electrode GE1. Next, the interlayer insulating film IL1 is etched by using the photoresist film as a mask. For example, the interlayer insulating film IL1 is etched by dry etching using a gas (fluorine-based gas) whose main component is $SF_6$. Thereby, a part of the first gate electrode GE1 is exposed.

Next, over the exposed portion (opening portion) of the first gate electrode GE1 and the interlayer insulating film IL1, as a conductive film for the second gate electrode GE2, for example, an Al film is deposited with a film thickness of about 100 nm by using a sputtering method or the like. It is possible to appropriately adjust constituent materials and the film thickness of the conductive film for the second gate electrode GE2. Next, a photoresist film (not shown in FIG. 27) is formed in a second gate electrode GE2 forming region by using a photolithography technique, and the second gate electrode GE2 is formed by etching the Al film by using the photoresist film as a mask. In this case, for example, a gate length of the second gate electrode GE2 is set to substantially the same as that of the first gate electrode GE1.

Figure 28:
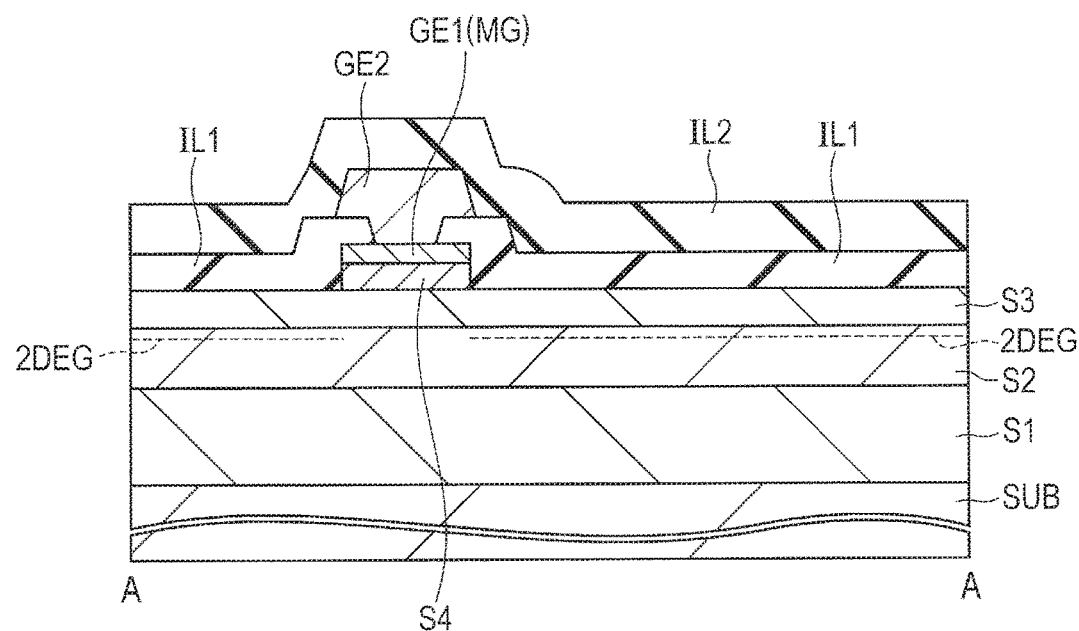
FIG. 28 a cross-sectional view showing a manufacturing process of the semiconductor device of the first embodiment.

Next, as shown in FIG. 28, the interlayer insulating film IL2 is formed over the second gate electrode GE2. For example, as the interlayer insulating film IL2, a silicon oxide film is deposited by about 100 nm by using the CVD method or the like. As the silicon oxide film, it is possible to use a so-called TEOS film where tetraethyl orthosilicate is also used as a raw material.

Figure 29:
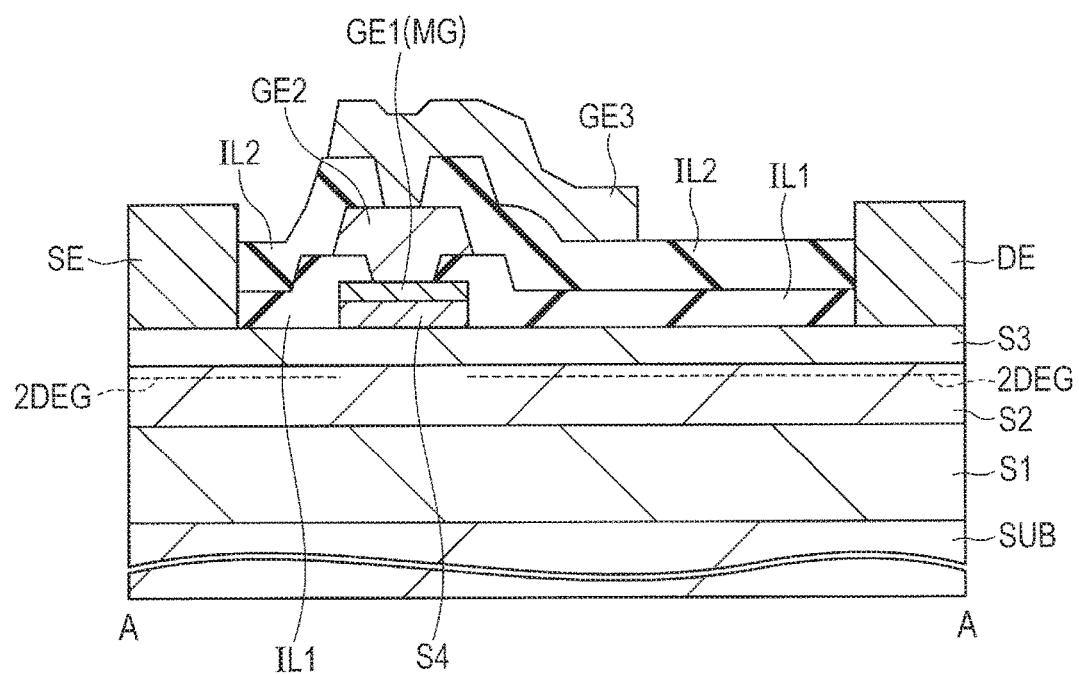
FIG. 29 a cross-sectional view showing a manufacturing process of the semiconductor device of the first embodiment.

Next, as shown in FIG. 29, the third gate electrode GE3 is formed. First, by using photolithography and an etching technique, the interlayer insulating film IL2 over the second gate electrode GE2 is removed and an opening portion is formed. For example, a photoresist film (not shown in FIG. 29) having an opening portion is formed over the interlayer insulating film IL2 over the second gate electrode GE2. Next, the interlayer insulating film IL2 is etched by using the photoresist film as a mask. For example, the interlayer insulating film IL2 is etched by dry etching using a gas (fluorine-based gas) whose main component is $SF_6$. Thereby, a part of the second gate electrode GE2 is exposed.

Next, over the exposed portion (opening portion) of the second gate electrode GE2 and the interlayer insulating film IL2, as a conductive film for the third gate electrode GE3, for example, an Al film is deposited with a film thickness of about 100 nm by using a sputtering method or the like. It is possible to appropriately adjust constituent materials and the film thickness of the conductive film for the third gate electrode GE3. Next, a photoresist film (not shown in FIG. 29) is formed in a third gate electrode GE3 forming region by using a photolithography technique, and the third gate electrode GE3 is formed by etching the Al film by using the photoresist film as a mask. In this case, a gate length of the third gate electrode GE3 is set longer than those of the first gate electrode GE1 and the second gate electrode GE2. More specifically, an end portion of the third gate electrode GE3 is extended toward the drain side or the source side more than an end portion of a laminated body of the mesa type fourth nitride semiconductor layer (cap layer) S4 and the first gate electrode GE1 or an end portion of the second gate electrode GE2. Thereby, as described above, the field plate effect can be obtained. The second gate electrode GE2 may be assumed to be wiring of a first layer, and the third gate electrode GE3 may be assumed to be wiring of a third layer.

Next, in the same manner as in the first embodiment, the source electrode SE and the drain electrode DE are formed. First, contact holes are formed in the interlayer insulating films IL1 and IL2 by using photolithography and an etching technique. Next, the source electrode SE and the drain electrode DE are formed in the contact holes and over the interlayer insulating film IL1. For example, a conductive film is formed over the interlayer insulating film IL2 including the inside of the contact holes. For example, an Al/Ti film is formed as the conductive film. Subsequently, the conductive film (Al/Ti film) is patterned.

Thereafter, an insulating film may be formed over the interlayer insulating film IL2 and over the source electrode SE and the drain electrode DE, and further, wiring may be formed over the insulating film. Furthermore, a protective film composed of an insulating film may be formed over the uppermost wiring.

The semiconductor device of the present embodiment can be formed by the processes described above. The processes described above is an example, and the semiconductor device of the present embodiment may be manufactured by processes other than the processes described above.

In the present embodiment, in the same manner as in the first embodiment, the fourth nitride semiconductor layer (cap layer) S4 is formed as a single layer film. However, the fourth nitride semiconductor layer (cap layer) S4 may be a multi-layer film described in the second to the fifth embodiments.

In the second to the fifth embodiments, when a non-doped layer and a layer where impurities are introduced (p-type layer or n-type layer) are provided in the fourth nitride semiconductor layer (cap layer) S4, it is preferable that the thickness of the non-doped layer is larger than that of the layer where impurities are introduced and the ratio of the film thicknesses of these layers is greater than 1. In other words, a ratio (ti/td) between the film thickness (ti) of the non-doped layer and the film thickness of the p-type layer or the n-type layer (when there is a plurality of layers where impurities are introduced, a total film thickness of these layers) is greater than 1.

While the invention made by the inventors has been specifically described based on the embodiments, it is needless to say that the present invention is not limited to the embodiments and may be variously modified without departing from the scope of the invention.

What is claimed is:

1. A semiconductor device comprising:
   a first nitride semiconductor layer;
   a second nitride semiconductor layer formed over the first nitride semiconductor layer;
   a third nitride semiconductor layer formed over the second nitride semiconductor layer;
   a mesa type fourth nitride semiconductor layer formed over the third nitride semiconductor layer;
   a source electrode formed over the third nitride semiconductor layer and on one side of the fourth nitride semiconductor layer;
   a drain electrode formed over the third nitride semiconductor layer and on the other side of the fourth nitride semiconductor layer; and
   a first gate electrode formed over the fourth nitride semiconductor layer,
   wherein electron affinity of the second nitride semiconductor layer is greater than or equal to electron affinity of the first nitride semiconductor layer,
   wherein electron affinity of the third nitride semiconductor layer is smaller than the electron affinity of the first nitride semiconductor layer,
   wherein electron affinity of the fourth nitride semiconductor layer is greater than or equal to the electron affinity of the second nitride semiconductor layer, and
   wherein the first gate electrode and the fourth nitride semiconductor layer are Schottky-joined.

2. The semiconductor device according to claim 1, wherein the fourth nitride semiconductor layer is a non-doped layer.

3. The semiconductor device according to claim 2, wherein the fourth nitride semiconductor layer is a non-doped GaN layer.

4. The semiconductor device according to claim 1, wherein the fourth nitride semiconductor layer is a laminated film of a non-doped layer and an n-type layer formed over the non-doped layer.

5. The semiconductor device according to claim 4, wherein the fourth nitride semiconductor layer is a laminated film of a non-doped GaN layer and an n-type GaN layer.

6. The semiconductor device according to claim 1, wherein the fourth nitride semiconductor layer is a laminated film of a p-type layer and a non-doped layer formed over the p-type layer.

7. The semiconductor device according to claim 6, further comprising:
   an n-type layer over the non-doped layer.

8. The semiconductor device according to claim 7,
wherein the fourth nitride semiconductor layer is a laminated film of a p-type GaN layer, a non-doped GaN layer, and an n-type GaN layer.

9. The semiconductor device according to claim 1,
wherein the fourth nitride semiconductor layer is a laminated film of an n-type layer, a first non-doped layer formed over the n-type layer, a p-type layer formed over the first non-doped layer, and a second non-doped layer formed over the p-type layer.

10. The semiconductor device according to claim 9,
wherein the fourth nitride semiconductor layer is a laminated film of an n-type Gan layer, a first non-doped GaN layer, a p-type Gan layer, and a second non-doped Gan layer.

11. The semiconductor device according to claim 1,
wherein the fourth nitride semiconductor layer is a laminated film of a non-doped layer and a p-type layer formed over the non-doped layer.

12. The semiconductor device according to claim 11,
wherein the fourth nitride semiconductor layer is a laminated film of a non-doped GaN layer and a p-type GaN layer.

13. The semiconductor device according to claim 1, further comprising:
a first insulating film formed over the third nitride semiconductor layer and the first gate electrode; and
a second gate electrode formed over the first gate electrode through an opening portion of the first insulating film,
wherein the second gate electrode more largely extends toward the source electrode or the drain electrode than the first gate electrode.

14. The semiconductor device according to claim 13,
wherein a film thickness of the first insulating film is greater than a film thickness of the fourth nitride semiconductor layer.

15. The semiconductor device according to claim 1, further comprising:
a first insulating film formed over the third nitride semiconductor layer and the first gate electrode;
a second gate electrode formed over the first gate electrode through a first opening portion of the first insulating film;
a second insulating film formed over the second gate electrode and the first insulating film, and
a third gate electrode formed over the second gate electrode through a second opening portion of the second insulating film.

16. The semiconductor device according to claim 15,
wherein the third gate electrode more largely extends toward the source electrode or the drain electrode than the first gate electrode.

17. A manufacturing method of a semiconductor device, the manufacturing method comprising the steps of:
(a) forming a second nitride semiconductor layer over a first nitride semiconductor layer;
(b) forming a third nitride semiconductor layer over the second nitride semiconductor layer;
(c) forming a fourth nitride semiconductor layer over the third nitride semiconductor layer;
(b) forming a first conductive film that is Schottky-joined with the fourth nitride semiconductor layer over the fourth nitride semiconductor layer; and
(e) forming a laminated body of the fourth nitride semiconductor layer of mesa type and a first gate electrode by processing the fourth nitride semiconductor layer and the first conductive film and exposing the third nitride semiconductor layer on both sides of the laminated body,
wherein electron affinity of the second nitride semiconductor layer is greater than or equal to electron affinity of the first nitride semiconductor layer,
wherein electron affinity of the third nitride semiconductor layer is smaller than the electron affinity of the first nitride semiconductor layer, and
wherein electron affinity of the fourth nitride semiconductor layer is greater than or equal to the electron affinity of the second nitride semiconductor layer.

18. The manufacturing method of a semiconductor device according to claim 17, further comprising the steps of:
(f) forming a first insulating film over the first gate electrode and the third nitride semiconductor layer, and
(g) forming a second gate electrode over the first gate electrode through a first opening portion of the first insulating film.

19. The manufacturing method of a semiconductor device according to claim 17,
wherein the step (c) is a step of sequentially forming an n-type layer, a first non-doped layer formed over the n-type layer, a p-type layer formed over the first non-doped layer, and a second non-doped layer formed over the p-type layer as the fourth nitride semiconductor layer.

20. The manufacturing method of a semiconductor device according to claim 18, further comprising the steps of:
(h) forming a second insulating film over the second gate electrode and the first insulating film, and
(i) forming a third gate electrode over the second gate electrode through a second opening portion of the second insulating film.

* * * * *